United States Patent
Mizushima et al.

(10) Patent No.: US 8,415,242 B2
(45) Date of Patent: Apr. 9, 2013

(54) NONVOLATILE SEMICONDUCTOR MEMORY DEVICE AND METHOD OF MANUFACTURING THE SAME

(75) Inventors: Ichiro Mizushima, Kanagawa (JP); Shinji Mori, Kanagawa (JP); Yoshiaki Fukuzumi, Kanagawa (JP); Fumiki Aiso, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 12/886,135

(22) Filed: Sep. 20, 2010

(65) Prior Publication Data

US 2011/0233646 A1 Sep. 29, 2011

(30) Foreign Application Priority Data

Mar. 23, 2010 (JP) ................................. 2010-066706

(51) Int. Cl.
  *H01L 21/3205* (2006.01)
(52) U.S. Cl. ................................. 438/591; 257/E21.409
(58) Field of Classification Search .................. 438/591, 438/267
  See application file for complete search history.

(56) References Cited

U.S. PATENT DOCUMENTS

| | | | |
|---|---|---|---|
| 7,851,296 B2 | 12/2010 | Noda et al. | |
| 8,013,383 B2 * | 9/2011 | Kidoh et al. | 257/324 |
| 8,194,467 B2 * | 6/2012 | Mikajiri et al. | 365/185.29 |
| 2008/0173932 A1 | 7/2008 | Kidoh et al. | |
| 2008/0179659 A1 | 7/2008 | Enda et al. | |
| 2009/0224309 A1 * | 9/2009 | Kidoh et al. | 257/326 |
| 2010/0181612 A1 * | 7/2010 | Kito et al. | 257/319 |
| 2010/0207195 A1 | 8/2010 | Fukuzumi et al. | |
| 2010/0213538 A1 | 8/2010 | Fukuzumi et al. | |
| 2010/0320526 A1 * | 12/2010 | Kidoh et al. | 257/324 |
| 2011/0014781 A1 | 1/2011 | Itokawa et al. | |
| 2011/0127597 A1 | 6/2011 | Fukuzumi et al. | |

FOREIGN PATENT DOCUMENTS

| | | |
|---|---|---|
| JP | 2007-317874 | 12/2007 |
| JP | 2008-10482 A | 1/2008 |
| JP | 2008-171918 | 7/2008 |
| JP | 2008-186868 A | 8/2008 |
| JP | 2008-270766 A | 11/2008 |
| JP | 2009-117843 | 5/2009 |
| JP | 2009-135328 | 6/2009 |
| JP | 2009-146954 | 7/2009 |
| JP | 2010-21390 A | 1/2010 |

OTHER PUBLICATIONS

Office Action issued Jul. 31, 2012, in Japanese Patent Application No. 2010-066706 with English translation.
U.S. Appl. No. 13/346,888, filed Jan. 10, 2012, Fukuzumi, et al.
U.S. Appl. No. 13/423,955, filed Mar. 19, 2012, Mori.

(Continued)

*Primary Examiner* — Lex Malsawma
(74) *Attorney, Agent, or Firm* — Oblon, Spivak, McClelland, Maier & Neustadt, L.L.P.

(57) ABSTRACT

According to one embodiment, a nonvolatile semiconductor memory device is provided in which memory strings, which are formed by providing a plurality of transistors having gate electrode films on sides of columnar semiconductor films in a height direction of the columnar semiconductor films via charge storage layers, are substantially perpendicularly arranged in a matrix shape on a substrate. A coupling section made of a semiconductor material that connects lower portions of the columnar semiconductor films forming a pair of the memory strings adjacent to each other in a predetermined direction is provided. Each of the columnar semiconductor films is formed of a generally single-crystal-like germanium film or silicon germanium film.

14 Claims, 20 Drawing Sheets

OTHER PUBLICATIONS

U.S. Appl. No. 13/227,882, filed Sep. 8, 2011, Mizushima, et al.
U.S. Appl. No. 12/834,390, filed Jul. 12, 2010, Megumi Ishiduki, et al.

Masanobu Miyao, et al., "High-quality single-crystal Ge stripes on quartz substrate by rapid-melting-growth", Applied Physics Letters, vol. 95, 022115, 2009, 3 pages.

* cited by examiner

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2010-066706, filed on Mar. 23, 2010; the entire contents of which are incorporated herein by reference.

FIELD

Embodiments described herein relate generally to a nonvolatile semiconductor memory device and a method of manufacturing the same.

BACKGROUND

In the field of a NAND flash memory, a stacked memory that can attain high integration without being limited by the limit of resolution of the lithography technique attracts attention. For example, a nonvolatile semiconductor memory device is proposed that has structure in which memory strings, which are formed by arranging a plurality of flat-shaped electrodes at predetermined intervals in a height direction to cross columnar semiconductor films having insulating films as charge storage layers formed to cover sides, are two-dimensionally arranged in a matrix shape and the flat-shaped electrodes are shared among the memory strings adjacent to one another in a first direction (see, for example, Japanese Patent Application Laid-Open No. 2008-171918).

In recent years, to improve characteristics of such a stacked memory, a nonvolatile semiconductor memory device is proposed in which bottoms of two memory strings adjacent to each other in a second direction orthogonal to a first direction are connected by a semiconductor layer (see, for example, Japanese Patent Application Laid-Open No. 2009-146954).

Such a nonvolatile semiconductor memory device is manufactured as explained below. First, a polysilicon film is formed above a semiconductor substrate, on which a peripheral circuit is formed, via an insulating film. A silicon oxide film and a polysilicon film to be the flat-shaped electrodes are alternately deposited on the polysilicon film. Subsequently, a U-shaped hole is formed in a memory string forming position. The insulating films as the charge storage layers are formed to cover inner walls of the U-shaped hole. Amorphous silicon layers are formed on the insulating films. Heat treatment is performed to crystallize the amorphous silicon layers and form polysilicon layers, whereby a U-shaped semiconductor layer to be a channel is formed in the U-shaped hole. Consequently, the nonvolatile semiconductor memory device in which the bottoms of the two memory strings are connected by the semiconductor layer is obtained.

In the method explained in Japanese Patent Application Laid-Open No. 2009-146954, the U-shaped semiconductor layer to be a channel is formed of polycrystal. Therefore, resistance essentially rises compared with that of a single-crystal semiconductor material and a high value cannot be realized as electric current flowing to the channel. Therefore, it is desirable that the semiconductor layer forming the channel is formed of single-crystal.

In the past, it is known that a single-crystalline germanium film is obtained by, after forming a linear polycrystal silicon film in a part on a quartz substrate and forming a linear germanium film to cross the polycrystal silicon film on the quartz substrate, performing annealing at temperature for melting the germanium film (see, for example, Masanobu Miyao, Kaoru Toko, Takanori Tanaka and Taizo Sadoh, High-quality single-crystal Ge stripes on quartz substrate by rapid-melting-growth, Applied Physics Letters, vol. 95, 022115 (2009)).

In the technology described in Masanobu Miyao, et al., the wire-like germanium film formed on a substrate plane is single-crystallized. However, the U-shaped semiconductor layer forming the channel cannot be single-crystallized by applying this manufacturing method to Japanese Patent Application Laid-Open No. 2009-146954. This is because a region functioning as a seed is necessary to form single-crystal and, as explained above, the charge storage layers are formed in the U-shaped hole and there is no region functioning as the seed for single-crystallizing the U-shaped semiconductor layer.

DETAILED DESCRIPTION

In general, according to one embodiment, a nonvolatile semiconductor memory device is proposed in which memory strings, which are formed by providing a plurality of transistors having gate electrode films on sides of columnar semiconductor films in a height direction of the columnar semiconductor films via charge storage layers, are substantially perpendicularly arranged in a matrix shape above a substrate and the gate electrode films of the transistors at the same height of the memory strings arranged in a first direction are connected. A coupling section formed of a semiconductor material that connects lower portions of the columnar semiconductor films forming a pair of the memory strings adjacent to each other in a second direction crossing the first direction is provided. Each of the columnar semiconductor films is formed of a generally single-crystal-like germanium film or silicon germanium film.

Exemplary embodiments of a nonvolatile semiconductor memory device will be explained below in detail with reference to the accompanying drawings. The present invention is not limited to the following embodiments. Perspective views and sectional views of the nonvolatile semiconductor memory device referred to in the embodiments explained below are schematic. A relation between the thickness and the width of a layer, a ratio of the thicknesses of layers, and the like are different from actual ones. Further, film thicknesses explained below are examples and actual film thicknesses are not limited to these film thicknesses.

Figure 1A:
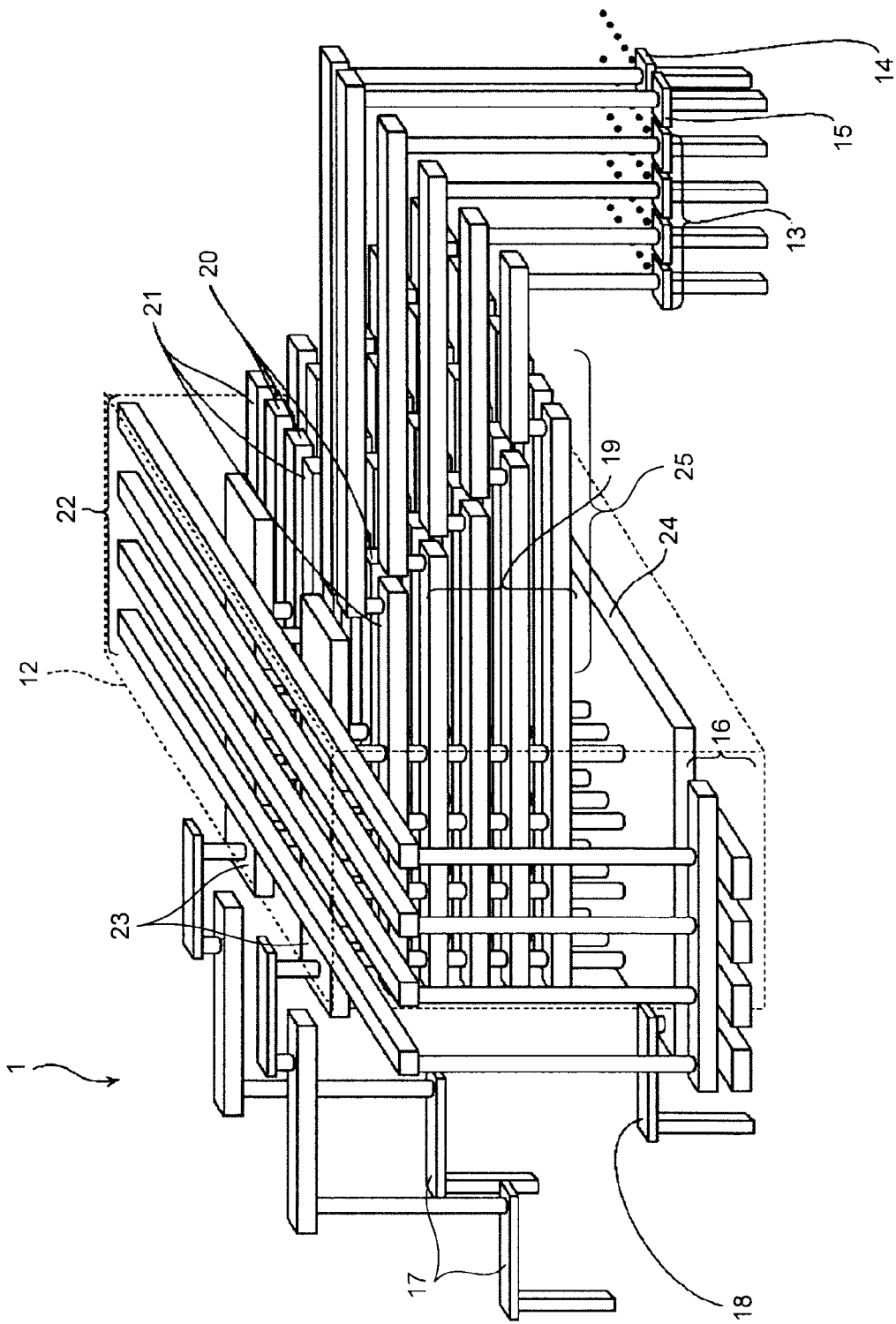
FIG. 1A is a schematic perspective view of an example of the structure of a nonvolatile semiconductor memory device according to a first embodiment.
Figure 1B:
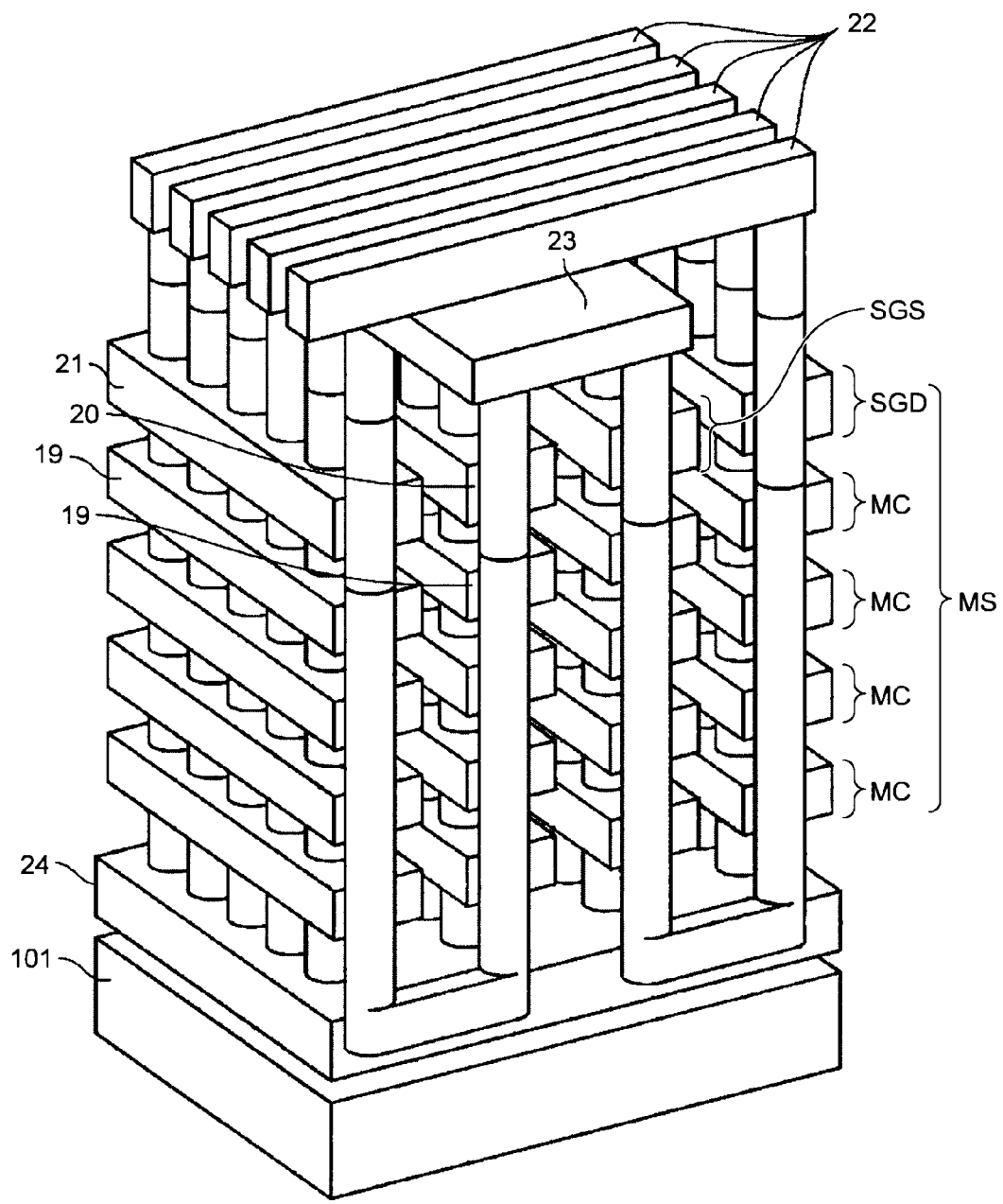
FIG. 1B is a detailed perspective view of the structure of a memory cell section shown in FIG. 1A.

FIG. 1A is a schematic perspective view of an example of the structure of a nonvolatile semiconductor memory device according to a first embodiment. FIG. 1B is a detailed perspective view of the structure of a memory cell section shown in FIG. 1A. A nonvolatile semiconductor memory device 1 mainly includes a memory cell section 12, word-line driving circuits 13, source-side selection-gate-line driving circuits 14, drain-side selection-gate-line driving circuits 15, a sense amplifier 16, source-line driving circuits 17, a back-gate-transistor driving circuit 18, word lines 19, source-side selection gate lines 20, drain-side selection gate lines 21, bit lines 22, source lines 23, and a back gate line 24.

The memory cell section 12 has a configuration in which memory strings MS are arranged in a matrix shape on the back gate line 24. The memory strings MS have a plurality of memory cell transistors (hereinafter also simply referred to as "memory cells") and drain-side selection transistors SGD or source-side selection transistors SGS provided at an upper end of a memory cell transistor row continuing in the height direction. Two memory strings MS adjacent to each other are connected at lower ends thereof. The connected two memory strings MS form one memory cell row. Therefore, the source-side selection transistor SGS is formed at an upper end of one memory string MS of one memory cell row. The drain-side selection transistor SGD is formed at an upper end of the other memory string MS.

The word lines 19 connect control-gate electrode films of the memory cells MC at the same height of the memory stings MS adjacent to one another in a predetermined direction. The direction in which the word lines 19 extend is hereinafter referred to as word line direction. The source-side selection gate lines 20 connect selection gate electrode films of the source-side selection transistors SGS of the memory strings MS adjacent to one another in the word line direction. The drain-side selection gate lines 21 connect selection gate electrode films of the drain-side selection transistors SGD of the memory strings MS adjacent to one another in the word line direction. The bit lines 22 are provided to be connected, in a direction (an orthogonal direction) crossing the word line direction, to upper portions of the memory strings MS in which the drain-side selection transistors SGD are formed. The direction in which the bit lines 22 extend is hereinafter referred to as bit line direction. The source lines 23 are provided to extend in the word line direction to be connected to upper portions of the memory stings MS in which the source-side selection transistors SGS are formed.

The word-line driving circuits 13 are circuits that control voltage applied to the word lines 19. The source-side selection-gate-line driving circuits 14 are circuits that control voltage applied to the source-side selection gate lines 20. The drain-side selection-gate-line driving circuits 15 are circuits that control voltage applied to the drain-side selection gate lines 21. The sense amplifier 16 is a circuit that amplifies potential read out from a selected memory cell. In the following explanation, when it is unnecessary to distinguish the source-side selection gate lines 20 and the drain-side selection gate lines 21, the source-side selection gate lines 20 and the drain-side selection gate lines 21 are simply referred to as selection gate lines. When it is unnecessary to distinguish the source-side selection transistors SGS and the drain-side selection transistors SGD, the source-side selection transistors SGS and the drain-side selection transistors SGD are simply referred to as selection transistors.

The back gate line 24 supports the memory strings MS at lower ends thereof and functions as a gate electrode of back gate transistors formed among the memory strings MS adjacent to one another in the bit line direction that form memory cell rows. The back-gate-transistor driving circuit 18 controls voltage applied to the back gate line 24. Bit-line driving circuits that control voltage applied to the bit lines 22 are not shown in the figure.

The word lines 19, the source-side selection gate lines 20, and the drain-side selection gate lines 21 of the memory cell section 12 and the word-line driving circuits 13, the source-side selection-gate-line driving circuits 14, and the drain-side selection-gate-line driving circuits 15 are respectively connected via contacts in a word-line contact section 25 provided adjacent to the memory cell section 12. The word-line contact section 25 is provided on the word-line driving circuits 13 side of the memory cell section 12. The word-line contact section 25 has structure in which word lines 19 and selection gate lines 20 and 21 connected to the memory cells MC at respective heights and the selection transistors SGS and SGD are processed in a step shape.

Figure 2:
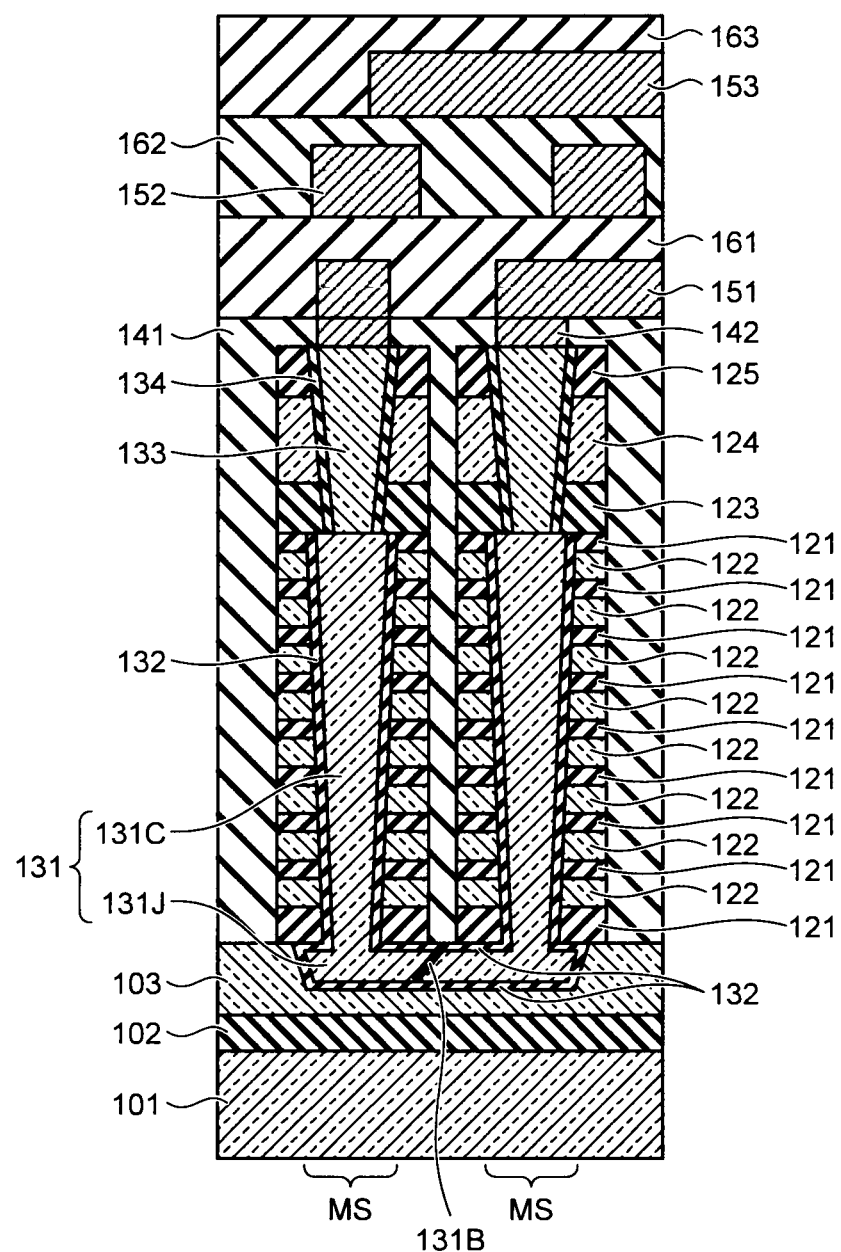
FIG. 2 is a schematic sectional view of an example of the configuration of a nonvolatile semiconductor memory device according to the first embodiment.

More detailed structure of the memory cell section 12 is explained. FIG. 2 is a schematic sectional view of an example of the configuration of the nonvolatile semiconductor memory device according to the first embodiment. A section in a direction perpendicular to the word line direction is shown. A flat back gate line 103 is formed above a semiconductor substrate 101 via an insulating film 102. Stacked films obtained by stacking a plurality of spacer films 121 and control-gate electrode films 122 are formed above a memory cell section forming region of the back gate line 103. Columnar semiconductor films 131C, sides of which are covered with charge storage layers 132, are formed to pierce through the stacked films. In other words, the nonvolatile semiconductor memory device has structure in which the memory cells MC having the control-gate electrode films 122 formed around the columnar semiconductor films 131C, on the sides of which the charge storage layers 132 are formed, are formed in a plurality of layers in the height direction. The memory cells MC adjacent to one another in the height direction are separated by the spacer films 121. In the figure, the memory cells MC in eight layers are stacked.

Lower portions of two columnar semiconductor films 131C adjacent to each other in the bit line direction are connected by a coupling section formed of a semiconductor film 131J, sides of which are covered with the charge storage layers 132. The coupling section includes, for example, a back gate transistor. The back gate transistor includes the charge storage layers 132 that can trap charges such as ONO films formed on sidewalls of a hollow formed to extend in the bit line direction in the back gate line 24, a semiconductor film 131J that fills the inside of the hollow, in which the charge storage layers 132 are formed, and is connected to the memory strings MS, and the back gate line 24 that is provided around the semiconductor film 131J and functions as a control gate electrode. In this way, a U-shaped semiconductor film 131 is formed by the two columnar semiconductor films 131C adjacent to each other in the bit line direction, and the semiconductor film 131J that connects the lower parts of the two columnar semiconductor films 131C.

Stacked films including interlayer insulating film 123 selection-gate electrode films 124 and protective insulating films 125 are stacked on the stacked film in which the columnar semiconductor films 131C are formed. To correspond to forming positions of the columnar semiconductor films 131C, columnar semiconductor films 133, sides of which are covered with gate insulating films 134, are formed to pierce through the stacked films formed by the three films. In other words, the selection transistors SGS and SGD having the selection-gate electrode films 124 formed around the columnar semiconductor films 133, on the sides of which the gate insulating films 134 are formed, are formed in top layers of the memory cells MC formed in the height direction. One selection transistor of the two memory strings MS forming the memory cell row is the source-side selection transistor SGS and the other selection transistor is the drain-side selection transistor SGD.

As explained above, the memory strings MS are formed by the columnar semiconductor films 131C, above the sides of which the control-gate electrode films 122 are formed via the charge storage layers 132, and the columnar semiconductor films 133, above the sides of which the selection-gate electrodes 124 are formed via the gate insulating films 134. One memory cell row is formed by two memory strings MS and the semiconductor film 131J connecting the memory strings MS.

The memory stings MS adjacent to each other in the bit line direction is separated by an interlayer insulating film 141 buried in a trench extending in the word line direction. Consequently, in the memory cell section 12, the selection-gate electrode films 124 of the selection transistors SGS and SGD of the memory strings MS arrayed in the word line direction are connected to each other. The control-gate electrode films 122 of the memory cell transistors MC at the same height of the memory strings MS arrayed in the word line direction are also connected to each other.

The interlayer insulating film 141 is also formed on the protective insulating films 125 in which the columnar semiconductor films 133 are formed. A multilayer wiring layer having bit lines, source lines, and the like are formed. On the interlayer insulating film 141, wiring layers 151, an interlayer insulating film 161, wiring layers 152, an interlayer insulating film 162, wiring layers 153, and an interlayer insulating film 163 are formed in order. The wiring layers 151 are electrically connected to upper surfaces of the memory strings MS of the memory cell section via contacts 142 formed in the interlayer insulating film 161. As a material of the contacts 142 and the wiring layers 151 to 153, for example, W or Al can be used. As a material of the interlayer insulating films 141 and 161 to 163, for example, a silicon oxide film can be used.

A material of the semiconductor substrate 101 and the columnar semiconductor films 133 can be selected out of, for example, Si, Ge, SiGe, SiSn, PbS, GaAs, InP, GaP, GaN, ZnSe, and InGaAsP. As the control-gate electrode films 122 and the selection-gate electrode films 124, for example, a conductive film of W, TaN, TiN, TiAlN, WN, WSi, CoSi, NiSi, PrSi, NiPtSi, PtSi, Pt, Ru, $RuO_2$, a B-doped polysilicon film, a P-doped polysilicon film, or the like can be independently used or used in stack. As the spacer films 121, an insulative material such as a silicon oxide film or a silicon nitride film can be used. As the gate insulating films 134, a silicon oxide film or the like can be used.

The charge storage layers 132 are layers that can store charges. As the charge storage layers 132, a layer having structure of a tunnel insulating film/a charge trapping film/a charge blocking film can be used. As such charge storage layers 132, for example, a silicon oxide film/silicon nitride film/silicon oxide film (ONO) structure can also be used or an aluminum oxide film/silicon oxide film/silicon oxide film (ANO) can also be used. Instead of the aluminum oxide film of the ANO structure, a metal oxide film of $HfO_2$, $La_2O_3$, $Pr_2O_3$, $Y_2O_3$, $ZrO_2$, or the like or a film formed by combining a plurality of such metal oxide films can also be used. In these structures, the ONO film can also be used as a tunnel insulating film.

In the nonvolatile semiconductor memory device according to the first embodiment, the semiconductor films 131C and 131J forming the memory strings MS are formed of single-crystal-like germanium or silicon germanium. Specifically, the columnar semiconductor film 131C forming one memory string MS of the two memory strings MS forming the memory cell row is formed of single-crystal-like germanium or silicon germanium grown in certain orientation. The columnar semiconductor film 131C forming the other memory string MS is formed of single-crystal-like germanium or silicon germanium grown in certain orientation. In the semiconductor film 131J under the columnar semiconductor films 131C, the crystal orientations in the columnar semiconductor films 131C are succeeded. Usually, it is rare that the crystal orientations of the two columnar semiconductor films 131C are the same. Therefore, a grain boundary 131B between single-crystal films forming the two columnar semiconductor films 131C is formed in the semiconductor film 131J under the columnar semiconductor films 131C. When the crystal orientations of the two columnar semiconductor films 131C are the same, the grain boundary 131B is not formed in the single-crystal films forming the two columnar semiconductor films 131C.

In this way, in the first embodiment, the semiconductor films 131C to be channels of the memory cells MC are formed of single-crystal-like germanium or silicon germanium. Therefore, it is possible to reduce resistance compared with resistance obtained when the channels are formed of a poly-crystal semiconductor material and increase a value of electric current fed to the channels.

FIGS. 3A to 3K are schematic sectional views of an example of a procedure of a method of manufacturing the nonvolatile semiconductor memory device according to the first embodiment. In these figures, a section in the direction perpendicular to the word line direction is shown.

Figure 3A:
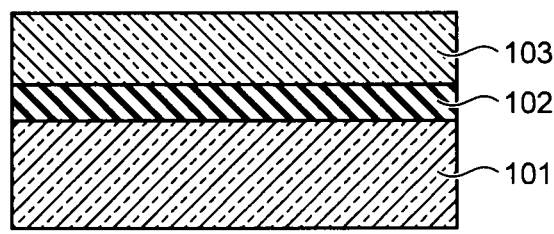
FIGS. 3A to 3K are schematic sectional views of an example of a procedure of a method of manufacturing the nonvolatile semiconductor memory device according to the first embodiment.
Figure 3B:
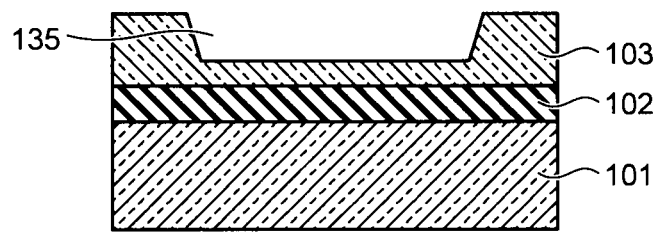
Figure 3C:
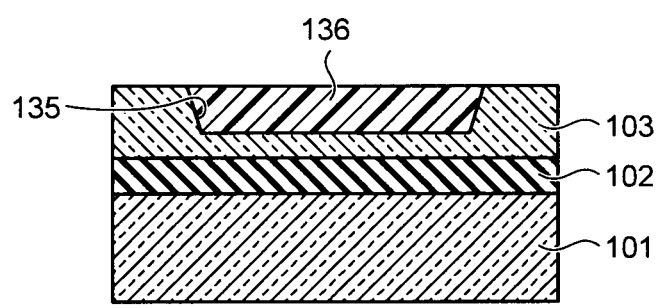

First, as shown in FIG. 3A, a not-shown peripheral circuit is formed on the semiconductor substrate 101. The insulating film 102 and the back gate line 103 formed of a polysilicon film or the like are formed above the semiconductor substrate 101 on which the peripheral circuit is formed. Subsequently, as shown in FIG. 3B, a trench 135 for forming a connecting section is formed by using the lithography technique and the etching technique. The trench 135 is formed at length that enables connection of the two memory strings MS adjacent to each other in the bit line direction. Thereafter, as shown in FIG. 3C, a sacrificial layer 136 of polyimide or the like is buried in the trench 135.

Figure 3D:
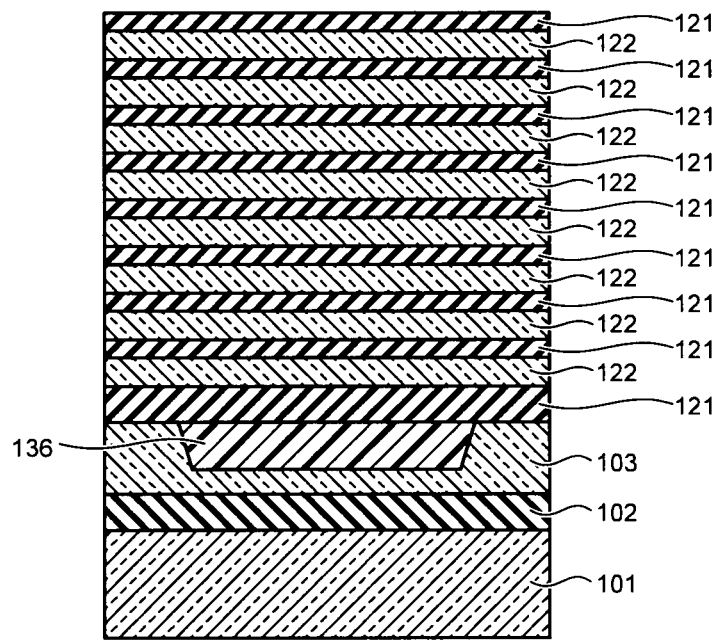

As shown in FIG. 3D, the spacer films 121 and the control-gate electrode films 122 to be control gate electrodes of the memory cells MC are alternately stacked in a plurality of layers on the back gate line 103, in which the sacrificial film 136 is buried, by a film forming method such as the sputtering method or the chemical vapor deposition (CVD) method to place the spacer film 121 in the top layer. As a material of the spacer films 121, an insulative material such as a silicon oxide film that electrically separates the upper and lower control-gate electrode films 122 can be used. As the control-gate electrode films 122, for example, an n-type polysilicon film or a p-type polysilicon film can be used.

Figure 3E:
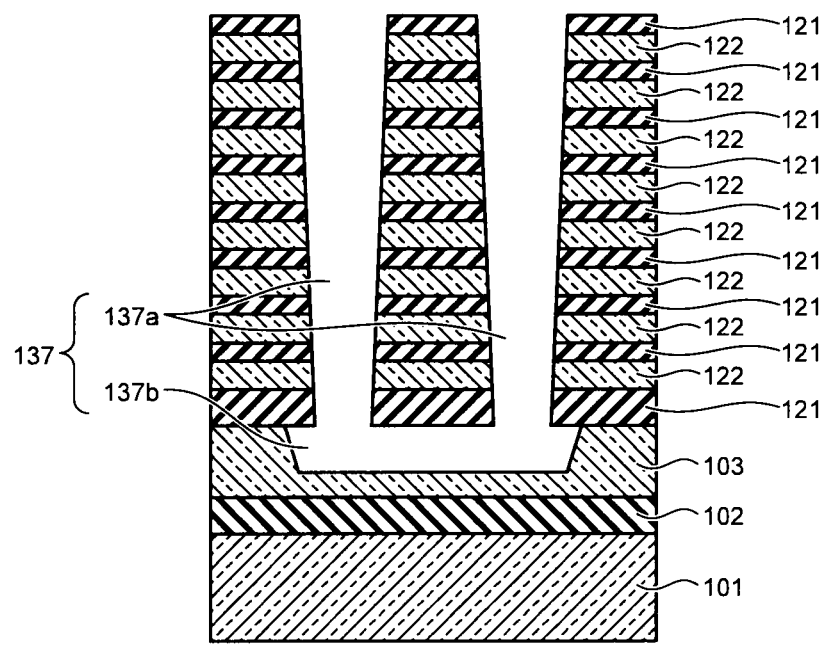

As shown in FIG. 3E, through holes 137*a* communicating with the sacrificial layer 136 are formed in forming positions of the memory strings MS by using the lithography technique and the etching technique. Two through holes 137*a* are formed to be provided at a predetermined space on a forming position of the sacrificial film 136 formed on the back gate line 103. Thereafter, the sacrificial film 136 buried in the back gate line 103 is removed by a method such as resist stripping processing in which oxygen gas is used. A communicating pipe 137*b* connecting the two through holes 137*a* adjacent to each other in the bit line direction is formed in the back gate line 103. As a result, a U-shaped hole 137 as a die for forming the semiconductor film 131 is formed by the two through holes and the communicating pipe 137*b* that connects the bottoms of the through holes 137*a*.

Figure 3F:
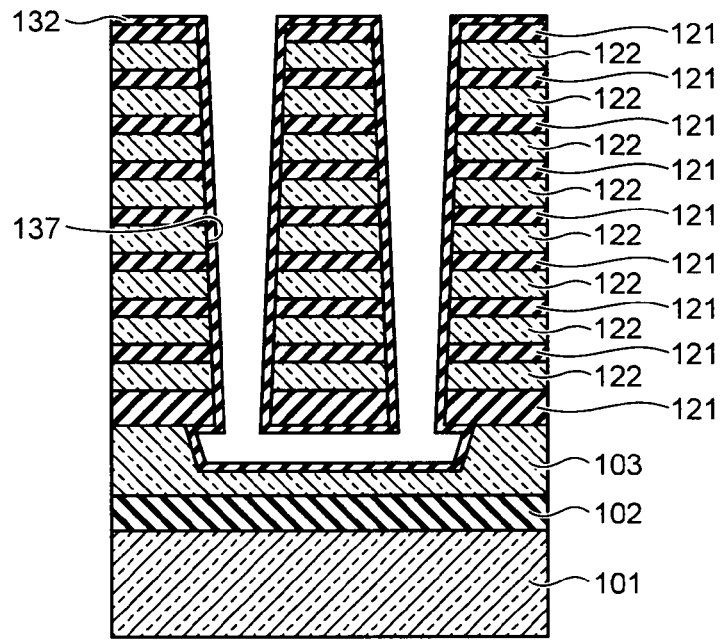

As shown in FIG. 3F, the charge storage layers 132 are formed on sides of the U-shaped hole 137 by a method such as the CVD method. As the charge storage layers 132, for example, a stacked film of a silicon oxide film/a silicon nitride film/a silicon oxide film can be used.

Figure 3G:
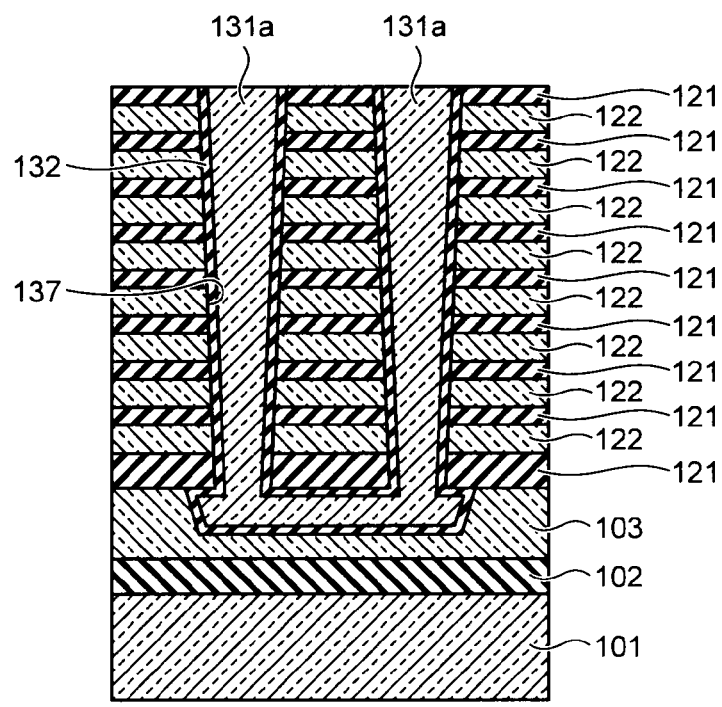

As shown in FIG. 3G, an amorphous germanium film 131*a* is formed by a method such as the CVD method to be buried in the U-shaped hole 137, on the sides of which the charge storage layers 132 are formed. Thereafter, the charge storage layers 132 and the amorphous germanium films 131*a* formed above the spacer film 121 in the top layer are removed by a method such as the chemical mechanical polishing (CMP). Consequently, the amorphous germanium film 131*a* is buried in the U-shaped hole 137.

Figure 3H:
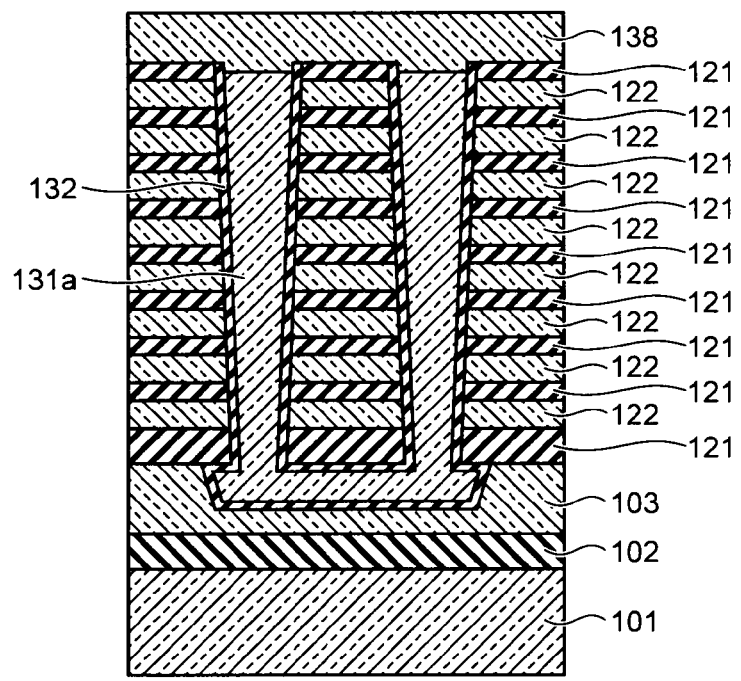

As shown in FIG. 3H, a seed film 138 made of amorphous silicon or the like is formed on the spacer films 121, in which the amorphous germanium films 131*a* are buried, by a method such as the CVD method. Thereafter, in this state, heat treatment is performed for a predetermined time at temperature higher than a melting point (about 900° C.) of germanium. For example, the heat treatment is performed for one second at 1,000° C. By the heat treatment, the amorphous germanium film 131*a* is melted and, on the other hand, amorphous silicon forming the seed film 138 is polycrystallized. Interdiffusion occurs in a boundary between the amorphous germanium film 131*a* and the amorphous silicon film.

After the heat treatment, the process enters a temperature falling step. When the temperature passes the melting point of germanium, germanium solidifies. The solidifying begins from a place where a melting point is relatively high, i.e., a diffusion region where germanium comes into contact with the seed film 138 in the upper layer and is diffused in germanium due to interdiffusion. At this point, crystal orientation in the diffusion region succeeds only orientation of one crystal grain in the polysilicon forming the seed film 138 in contact with germanium. As a result, germanium in the melted state is gradually crystallized from the region in contact with the seed film 138 toward a lower portion of the U-shaped hole 137.

In this example, the heat treatment time is set to one second. However, the heat treatment time can also be shorter or longer than one second. If the heat treatment time is too long, interdiffusion between germanium and silicon occurs. In a region where the interdiffusion occurs, concentration gradient of germanium is formed and satisfactory crystallinity cannot be obtained. Therefore, the heat treatment time is desirably as short as possible. However, if the heat treatment time is too short, the inside of the U-shaped hole 137 formed as a stacked film cannot be kept as uniform temperature. Therefore, the too-short heat treatment time is undesirable.

As the heat treatment time, time as short as possible is desirable in a range in which the region on the inside of the U-shaped hole 137, which should be melted, can be uniformly heated and melted and temperature can be uniformly declined. For example, if the heat treatment time if equal to or shorter than 100 milliseconds and, desirably, 0.1 to 10 milliseconds, the formation of concentration gradient can be suppressed.

As a result, for example, in upper portions of the columnar semiconductor films 131C, a silicon germanium region having silicon concentration equal to or higher than 30 at % is formed. In lower portions of the columnar semiconductor films 131C, a silicon germanium region having silicon concentration equal to or lower than 10 at % is formed. Such a difference in concentration due to a position depends on temperature and time of the heat treatment. As the temperature is higher or the time is longer, silicon concentration as a whole tends to be high.

Figure 3I:
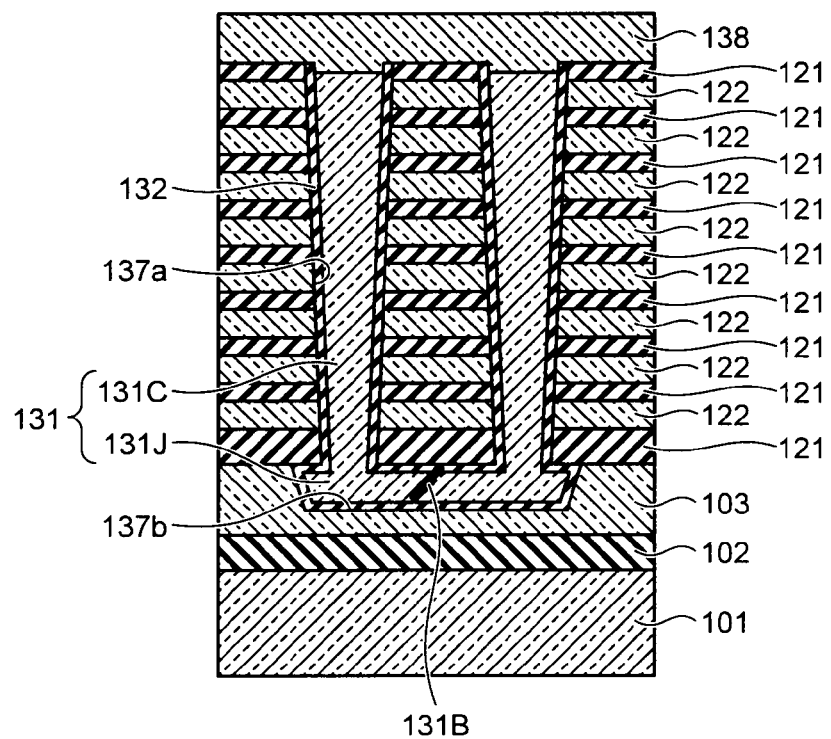

By the heat treatment, as shown in FIG. 3I, in the through holes 137*a* in columnar sections of the U-shaped hole 137, the semiconductor films 131C formed of single-crystal germanium having crystal orientation of one crystal grain in contact with the amorphous germanium film 131*a* among the polysilicon grains formed in the seed film 138 is formed. Usually, crystal orientations of crystal grains in regions formed on the two columnar sections in the seed film 138 are different. Therefore, orientations of single-crystal germanium films respectively formed in the two columnar sections are different. As a result, on the inside of the U-shaped hole 137, the grain boundary 131B of the two single-crystal germaniums is formed on the inside of the U-shaped hole 137. In general, the grain boundary 131B is formed in the connecting section (the semiconductor film 131J in the communicating pipe 137*b*). However, a position where the grain boundary 131B is formed is different depending on a difference in speed of crystallization of germanium in the melted state in the two through holes 137*a*. The semiconductor films 131C formed in the through holes 137*a* are desirably single-crystal. However, the semiconductor films 131C can also be a substantially single-crystal-like semiconductor film formed of about several crystal grains including a defect such as twin or dislocation.

Figure 3J:
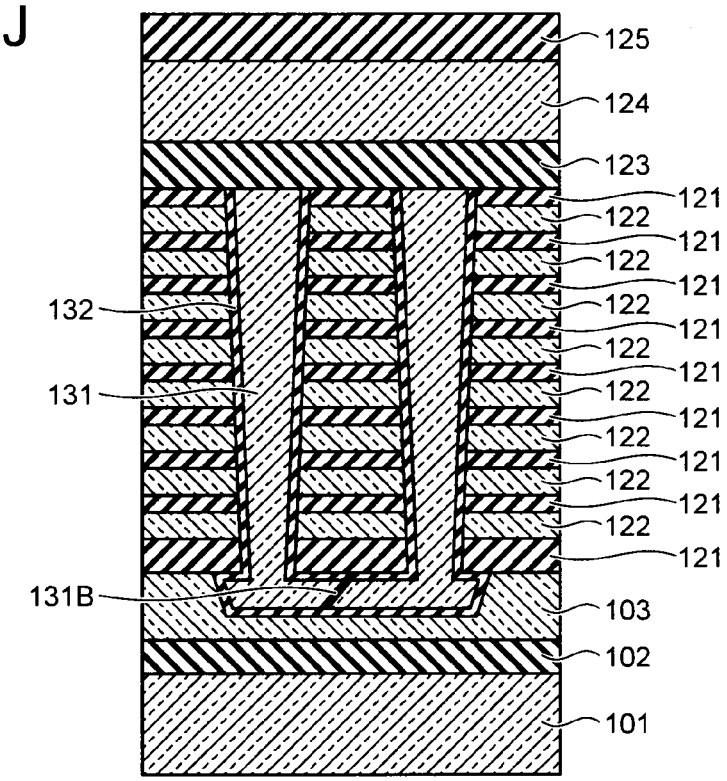

As shown in FIG. 3J, the seed film 138 is removed by a method such as the etching method including the reactive ion etching (RIE) method or the CMP method. Upper surfaces of the semiconductor films 131C formed of single-crystal germanium are exposed. Thereafter, the interlayer insulating film 123, the selection-gate electrode film 124, and the protective insulating film 125 are deposited in order on the spacer film 121 in the top layer in which the semiconductor films 131C are exposed.

Figure 3K:
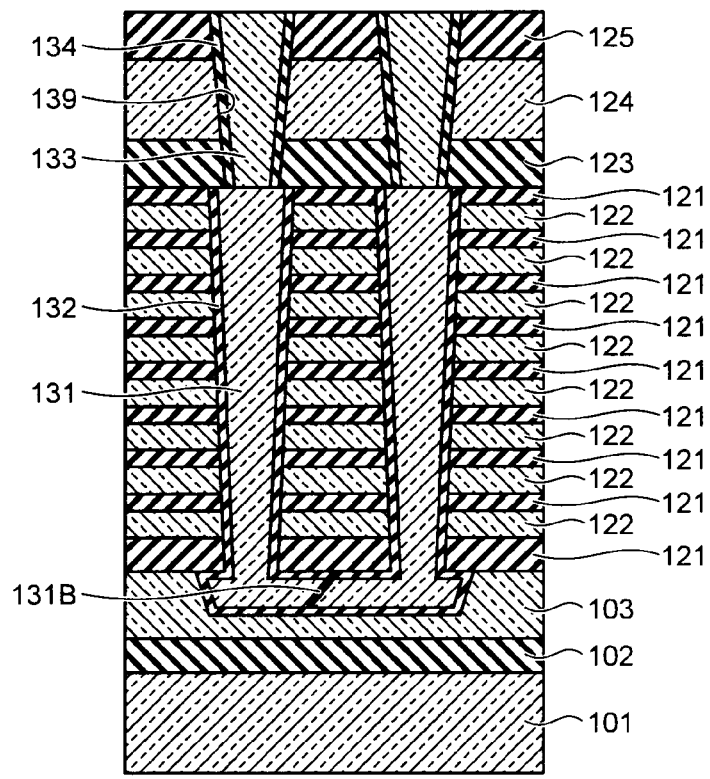

As shown in FIG. 3K, through holes 139 communicating with the upper surfaces of the columnar semiconductor films 131C are formed in the interlayer insulating film 123, the selection-gate electrode film 124, and the protective insulating film 125 by using the lithography technique and the etching technique. Thereafter, the gate insulating films 134 for selection transistors are formed by a method such as the CVD method to cover inner surfaces of the through holes 139. Subsequently, the semiconductor films 133 made of, for example, an n-type polysilicon film are formed to be buried in the through holes 139, in which the gate insulating films 134 are formed, by a method such as the CVD method. Thereafter, the semiconductor films 133 and the gate insulating films 134 formed above the protective insulating film 125 are removed by the CMP method. Consequently, the semiconductor films 133 to be channels of selection transistors are buried in the through holes 139. The memory strings MS in which the columnar semiconductor films 131C forming the channels of the memory cells MC and the columnar semiconductor films 133 forming the channels of the selection transistors are stacked are formed.

The memory strings MS adjacent to each other in the bit line direction are separated and processing for forming wiring layers 151 to 153 connected to the memory strings MS is performed. The nonvolatile semiconductor memory device having the structure shown in FIG. 2 is obtained. Specifically, the layers from the protective insulating film 125 to the spacer films 121 in the bottom layer are collectively processed by the lithography technique and the etching technique to form a not-shown trench that separates the memory strings MS adjacent to each other in the bit line direction. The trench has a shape extending in the word line direction. Consequently, the control-gate electrode film 122 and the selection-gate electrode film 124 are physically separated between memory string rows adjacent to each other in the bit line direction. Thereafter, the interlayer insulating film 141 is formed on the protective insulating film 125 by a film forming method such as the CVD method to fill the formed trench. The contacts 142 connected to the semiconductor films 133 are formed in the interlayer insulating film 141. The wiring layers 151 to 153 and the like connected to the contacts 142 are formed on the interlayer insulating film 141 via the interlayer insulating films 161 to 163 to form a multilayer wiring layer. Consequently, the nonvolatile semiconductor memory device having the structure shown in FIG. 2 is obtained.

According to the first embodiment, the single-crystal germanium films are formed as the semiconductor films 131C in the regions where the memory cell transistors MC are formed. Therefore, there is an effect that the resistance of the channel regions of the memory cell transistors MC can be reduced and a value of electric current flowing to the channels can be increased. Because the resistance of the channels is low, even if a sectional area of the semiconductor films 131C is microminiaturized or the length of the memory strings MS is increased, a fall in a current value is prevented, a fall in writing and readout speed is suppressed, and operation is not hindered. As a result, there is an effect that stored bit density can be increased. Because germanium is used as the channels, threshold voltage of the transistors changes more than a change that occurs when the channels are formed of silicon. To obtain a high current value, PMOS memory cell transistors in which holes are used as carriers can also be used. In such a case, P-type polysilicon is desirably used for the control-gate electrode films 122.

FIGS. 4A to 4D are schematic sectional views of an example of a procedure of a method of manufacturing a nonvolatile semiconductor memory device according to a second embodiment. In the figures, a section in a direction perpendicular to a word line direction is shown.

According to a procedure same as the procedure shown in FIGS. 3A to 3F in the first embodiment, after the insulating film 102, the back gate line 103, and the stacked films of the spacer films 121 and the control-gate electrode films 122 are formed above the semiconductor substrate 101 and the U-shaped hole 137 is formed, the charge storage layers 132 are formed to cover the sides of the U-shaped hole 137. A sectional area of the through holes 137a forming the U-shaped hole 137 in a stacking direction of the spacer films 121 and the control-gate electrode films 122 is formed to be smaller toward lower portions (bottoms) of the through holes 137a.

Figure 4A:
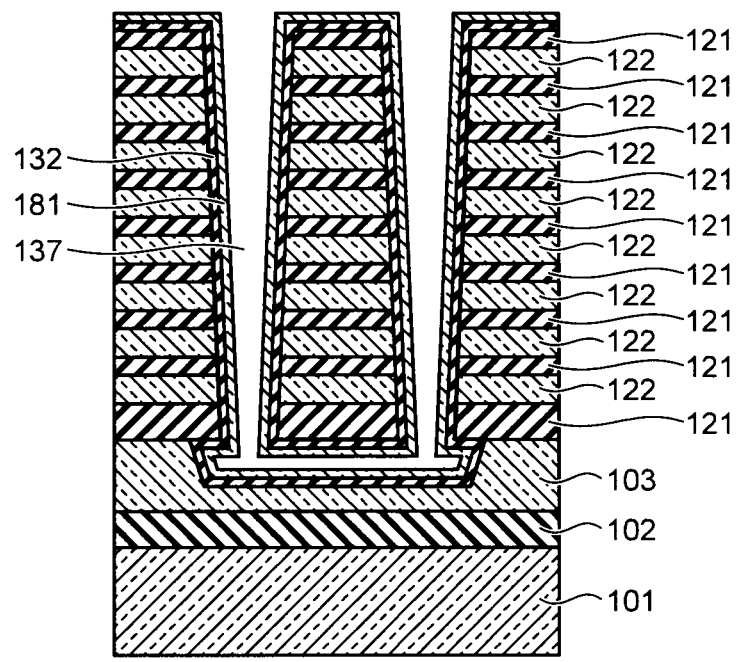
FIGS. 4A to 4D are schematic sectional views of an example of a method of manufacturing a nonvolatile semiconductor memory device according to a second embodiment.
Figure 4B:
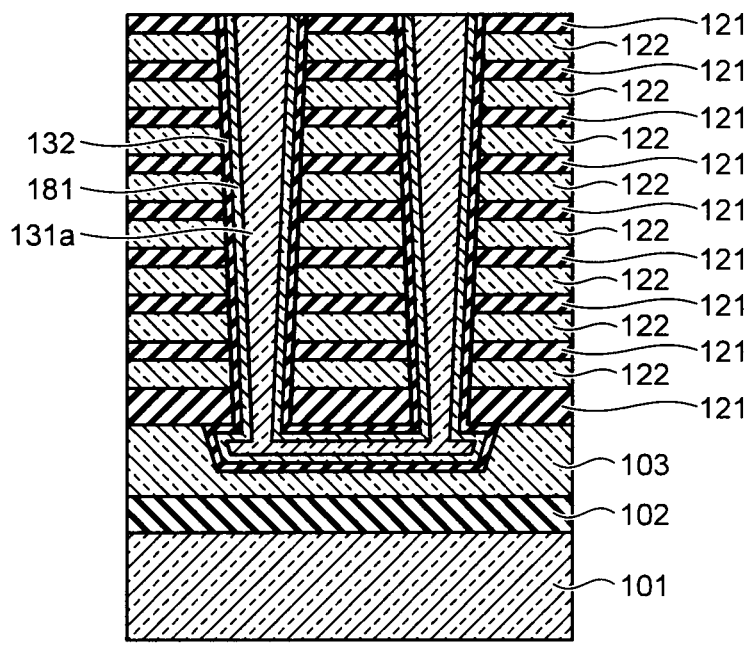

Subsequently, as shown in FIG. 4A, base layers 181 made of an amorphous silicon film are formed on the charge storage layers 132 by the CVD method in which disilane ($S_2H_6$) is used as a material source. The thickness of the amorphous silicon film can be set to, for example, 1.5 nanometers. Thereafter, continuously, as shown in FIG. 4B, the amorphous germanium films 131a are formed on the base layers 181 to be buried in the U-shaped hole 137, on the sides of which the charge storage layers 132 are formed. Thereafter, the charge storage layers 132, the base layers 181, and the amorphous germanium films 131a formed above the spacer film 121 in the top layer are removed by a method such as the CMP method. Consequently, the amorphous germanium films 131a are buried in the U-shaped hole 137. At this point, the diameter of the through holes 137a decreases downward and the thickness of the base layers 181 formed on the sides of the through holes 137a is fixed. Therefore, a ratio of silicon to germanium increases toward the lower portions of the through holes 137a. However, at least one region where the ratio of silicon to germanium is different from the ratio in regions around the region only has to be present in each of the through holes 137a.

Figure 4C:
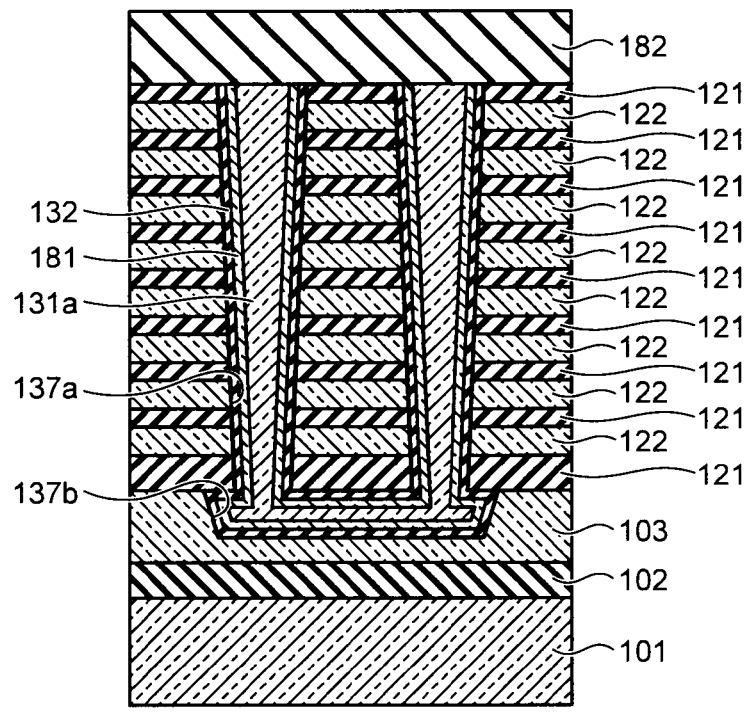

As shown in FIG. 4C, a cap film 182 made of a silicon oxide film or the like is formed on the spacer films 121, in which the amorphous germanium films 131a are buried, by a method such as the CVD method.

Thereafter, in this state, heat treatment is performed for a predetermined time at temperature higher than the melting point (about 900° C.) of germanium. Desirably, the temperature is set to temperature equal to or higher than a melting point determined from concentration in mixing germanium and silicon to create alloy on the inside of a region where germanium and silicon are buried. For example, when a ratio of germanium and silicon is 80:20 near the bottom of a groove, the melting point is about 1,000° C. Therefore, the heat treatment temperature is desirably equal to or higher than 1,000° C. For example, the heat treatment for one second is performed at 1,100° C. By the heat treatment, the amorphous germanium films 131a are melted, interdiffusion occurs between the amorphous germanium films 131a and amorphous silicon films near the amorphous germanium films 131a, and silicon germanium is melted in a section where the interdiffusion occurs. A melting point of this section rises compared with the melting point of the amorphous germanium films 131a. As a result, crystallization starting from a region having the high melting point occurs. Specifically, when the shape of the through holes 137a is narrowed, for example, toward the bottoms, an amount of germanium in a certain section decreases toward the bottoms and an amount of silicon increases toward the bottoms. Therefore, solidifying tends to progress starting from the bottoms (on the inside of the communicating pipe 137b or near the communication pipe 137b). As a result, in each of the through holes 137a, single-crystallization starting from the bottom occurs. The inside of each of the through holes 137a is formed of silicon germanium single crystal. A ratio of diameters of the upper portions and the bottoms of the through holes 137a is, for example, 100:80. Germanium concentration is lower compared with silicon concentration in the bottoms as the bottoms are smaller compared with the upper portions. As a result, a melting point is higher. In other words, because a difference of a melting point on the inside of the through holes 137a increases, crystallization starting from the bottoms can be surely caused. On the other hand, when the bottoms are not so small compared with the upper portions, there is an advantage that it is unnecessary to set the temperature for melting extremely high compared with the melting point of germanium. When there are a plurality of sections where crystallization starts, the columnar semiconductor film 131C has a substantially single-crystal-like structure formed of a plurality of single crystals. However, in this case, several crystal grains form the columnar semiconductor film 131C.

Figure 4D:
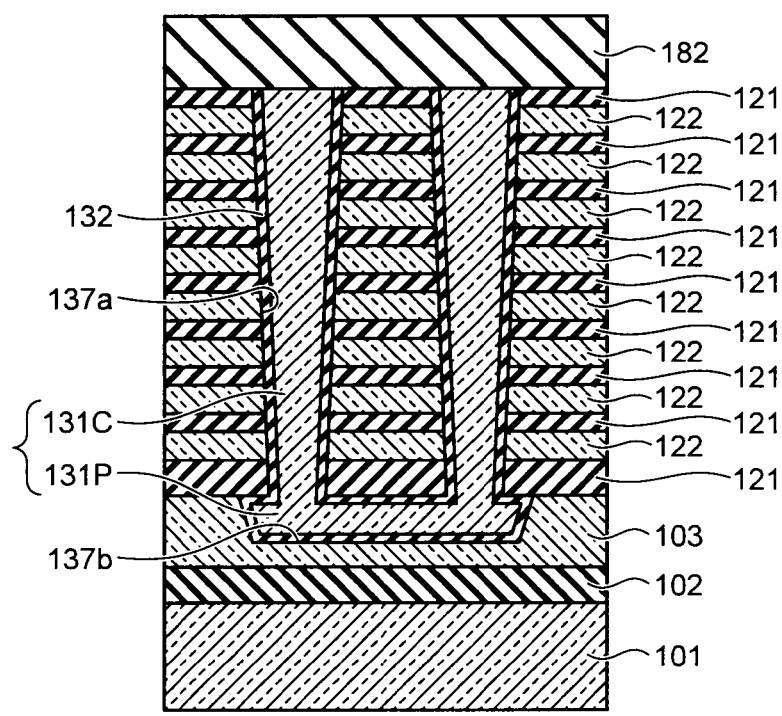

At this point, as shown in FIG. 4D, the communicating pipe 137b connecting the bottoms of the two columnar through holes 137a is formed of a plurality of crystals obtained by the progress of the crystallization starting from the bottoms of the through holes 137a on both the sides of the communicating pipe 137b. Therefore, the communicating pipe 137b is not single crystal. The communicating pipe 137b has a high melting point, silicon and germanium are not sufficiently mixed, and, therefore, the concentrations of silicon and germanium substantially changes in a region of the communicating pipe 137b. Therefore, the communicating pipe 137b is not single-crystal-like and is a semiconductor film 131P of a polycrystal state. A region of the semiconductor film 131P of the poly crystal state can also be expanded to lower regions of the semiconductor films 131C (the through holes 137a) of a columnar single-crystal region. However, because the memory cells MC are not formed in the forming region of the communicating pipe 137b, no particular problem occurs even if the communicating pipe 137b is not single crystal.

Thereafter, the nonvolatile semiconductor memory device shown in FIG. 2 is obtained by forming selection transistors and wiring layers in upper layers according to a procedure same as the procedure shown in FIG. 3J and subsequent figures in the first embodiment. A step of removing the cap film 182 can be omitted by using the cap film 182 as the interlayer insulating film 123 without removing the cap film 182. In the example explained above, as shown in FIG. 4C, the cap film 182 is formed on the spacer films 121, in which the amorphous germanium film 131a is buried, to perform the heat treatment. However, the heat treatment can also be performed without forming the cap film 182.

According to the second embodiment, effects same as those in the first embodiment can be obtained. In the explanation, the amorphous germanium film 131a is formed. However, a polycrystal germanium film can also be formed.

Figure 5:
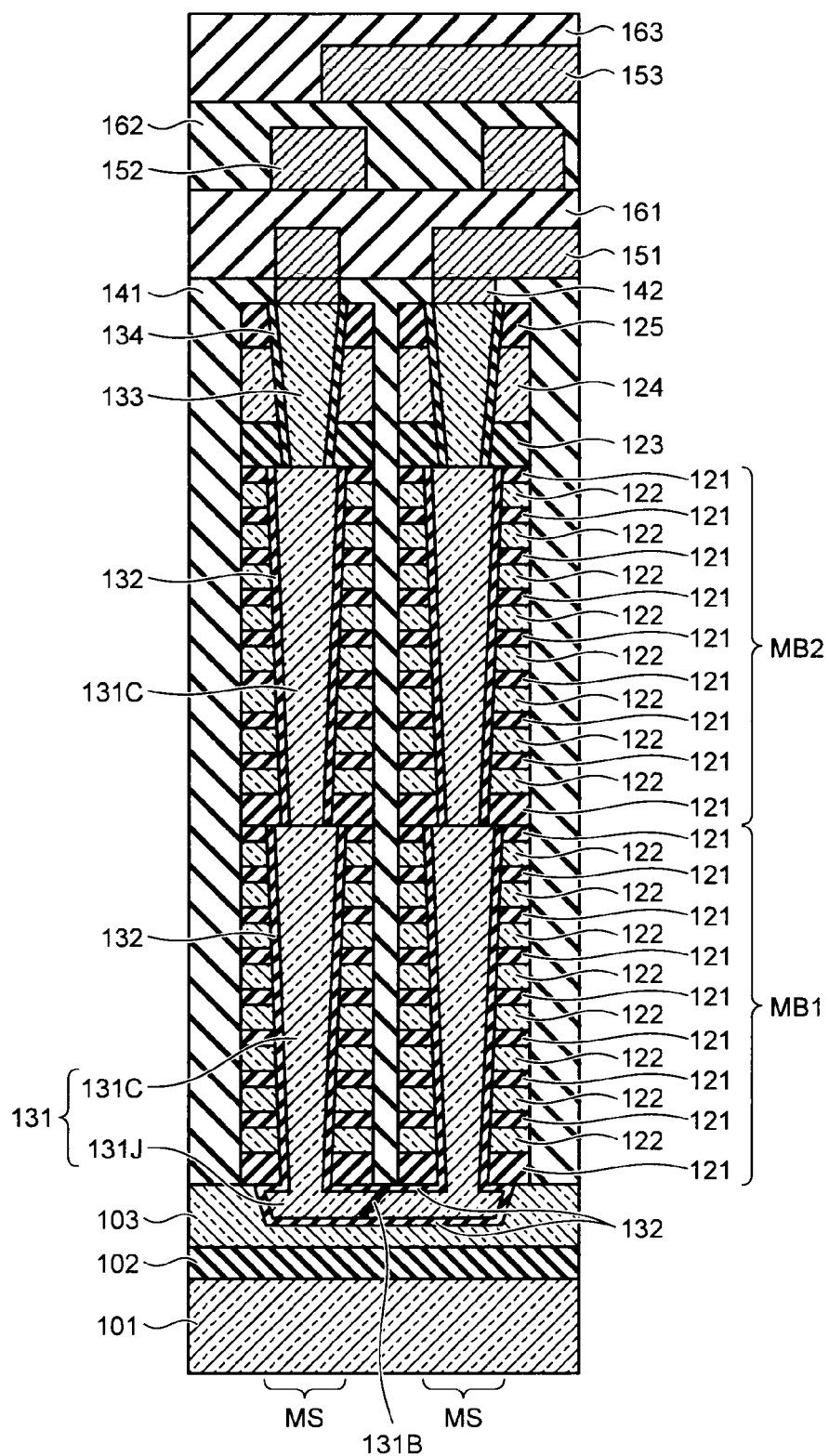
FIG. 5 is a schematic sectional view of an example of the configuration of a nonvolatile semiconductor memory device according to a third embodiment.

FIG. 5 is a schematic sectional view of an example of the configuration of a nonvolatile semiconductor memory device according to a third embodiment. A section in a direction perpendicular to a word line direction is shown. In the third embodiment, a plurality of memory blocks, in which a predetermined number of memory cell transistors are connected in series, are stacked in a stacking direction of memory cell transistors and formed. For example, the nonvolatile semiconductor memory device shown in FIG. 5 has structure in which the insulating film 102, the flat back gate line 103, a first memory block MB1 and a second memory block MB2 including a predetermined number of memory cells MC formed in the height direction in a plurality of layers, and selection transistors are formed above the semiconductor substrate 101.

The first and second memory blocks MB1 and MB2 have structure in which the columnar semiconductor films 131C, the sides of which are covered with the charge storage layers 132, are formed to pierce through stacked films formed by stacking the stacked films of the spacer films 121 and the control-gate electrode films 122 in a plurality of layers. In other words, the first and second memory blocks MB1 and MB2 have structure in which the memory cells MC having the control-gate electrode films 122 formed around the columnar semiconductor films 131C, on the sides of which the charge storage layers 132 are formed, are formed in the height direction in a plurality of layers. The memory cells MC adjacent to one another in the height direction are separated by the spacer films 121. In the figure, the memory cells MC in eight layers are stacked in one memory block MB1 and MB2.

The columnar semiconductor films 131C of the second memory block MB2 are formed on the columnar semiconductor films 131C of the first memory block MB1. Lower portions of the columnar semiconductor films 131C adjacent to each other in the bit line direction of the first memory block MB1 are connected by a coupling section formed of the semiconductor film 131J, the sides of which are covered with the charge storage layers 132. The coupling section includes, for example, a back gate transistor.

Other components are the same as those in the first embodiment. Therefore, explanation of the components is omitted. In the figure, the memory blocks are stacked in two layers. However, the memory blocks can also be stacked in three or more layers. The memory cells MC in eight layers are stacked in the memory block. However, the number of stacked memory cells MC is arbitrary.

FIGS. 6A to 6E are schematic sectional views of an example of a procedure of a method of manufacturing the nonvolatile semiconductor memory device according to the third embodiment. In these figures, a section in the direction perpendicular to the word line direction is shown.

First, according to a procedure same as the procedure shown in FIGS. 3A to 3F in the first embodiment, after the insulating film 102, the back gate line 103, and the stacked films of the spacer films 121 and the control-gate electrode films 122 are formed above the semiconductor substrate 101 and the U-shaped hole 137 is formed, the charge storage layers 132 are formed to cover the sides of the U-shaped hole 137.

According to a procedure same as the procedure shown in FIGS. 4A and 4B in the second embodiment, after the base layers 181 formed of an amorphous silicon film are formed at thickness of, for example, 1.5 nanometers on the inside of the U-shaped hole 137, the amorphous germanium film 131a is formed to fill the inside of the U-shaped hole 137. Thereafter, the charge storage layers 132, the base layers 181, and the amorphous germanium films 131a formed above the spacer film 121 in the top layer are removed by a method such as the CMP method.

Figure 6A:
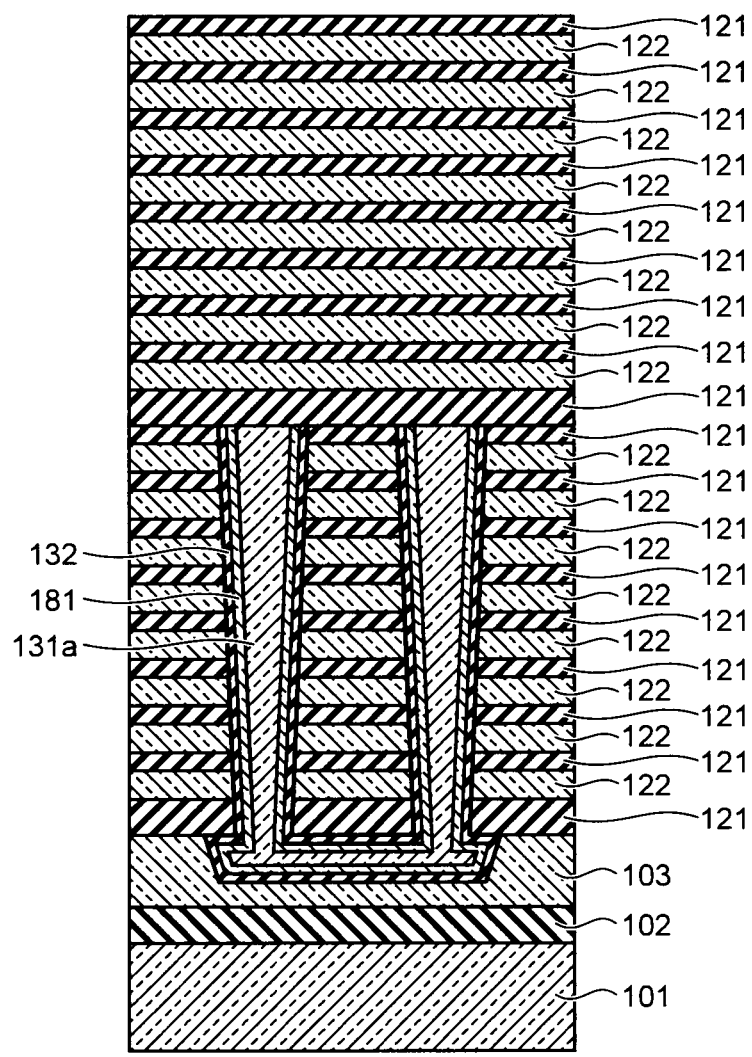
FIGS. 6A to 6E are schematic sectional views of an example of a procedure of a method of manufacturing the nonvolatile semiconductor memory device according to the third embodiment.

Subsequently, as shown in FIG. 6A, the spacer films 121 and the control-gate electrode films 122 to be control gate electrodes of the memory cells MC are alternately stacked in a plurality of layers on the spacer films 121, in which the amorphous germanium films 131a are buried, by a film forming method such as the sputtering method or the CVD method to place the spacer film 121 in the top layer. As a material of the spacer films 121, an insulative material such as a silicon oxide film that electrically separates the upper and lower control-gate electrode films 122 can be used. As the control-gate electrode films 122, for example, an n-type polysilicon film can be used.

Figure 6B:
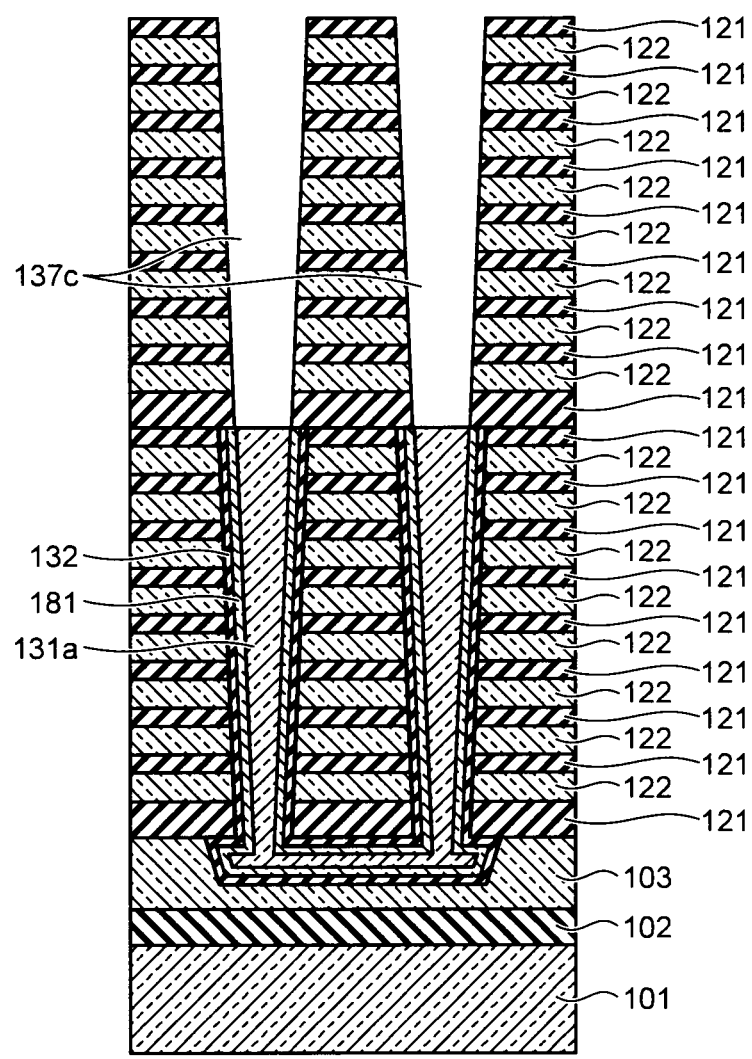

Thereafter, as shown in FIG. 6B, through holes 137c communicating with the columnar semiconductor films 131a formed in the lower layer are formed in forming positions of the memory strings MS by using the lithography technique and the etching technique.

Figure 6C:
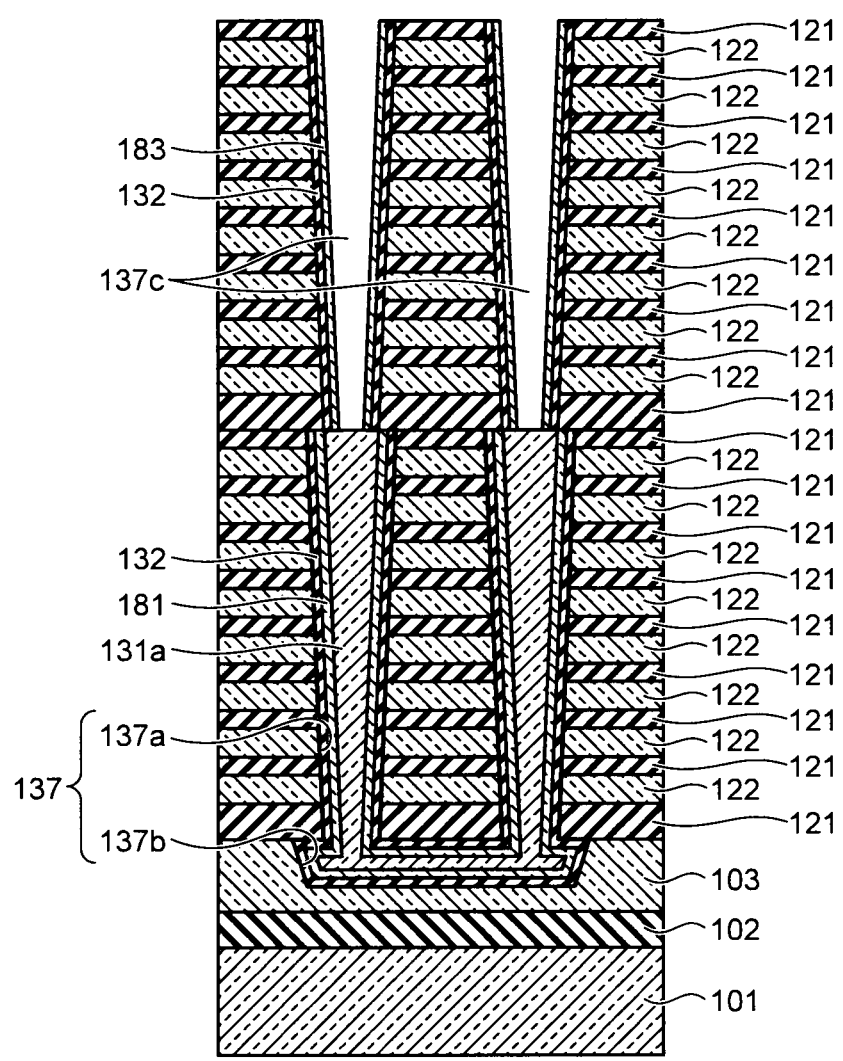

As shown in FIG. 6C, the charge storage layers 132 are formed on sides of the through holes 137c by a method such as the CVD method. As the charge storage layers 132, for example, a stacked film of a silicon oxide film/a silicon nitride film/a silicon oxide film can be used. Thereafter, after spacer silicon films 182 having thickness of, for example, 2 nanometers are deposited by the CVD method in which disilane is used as a material source, the spacer silicon films 182 and the charge storage layers 132 formed on the bottom surfaces of the through holes 137c are etched and removed by the RIE. Because the spacer silicon films 182 are present, it is possible to expose upper portions of the columnar semiconductor films 131a formed in the lower layer while protecting the columnar semiconductor films 131a from damage due to the RIE of the charge storage layers 132. In this state, the thickness of the spacer silicon films 182 is reduced to 1 nanometer.

Figure 6D:
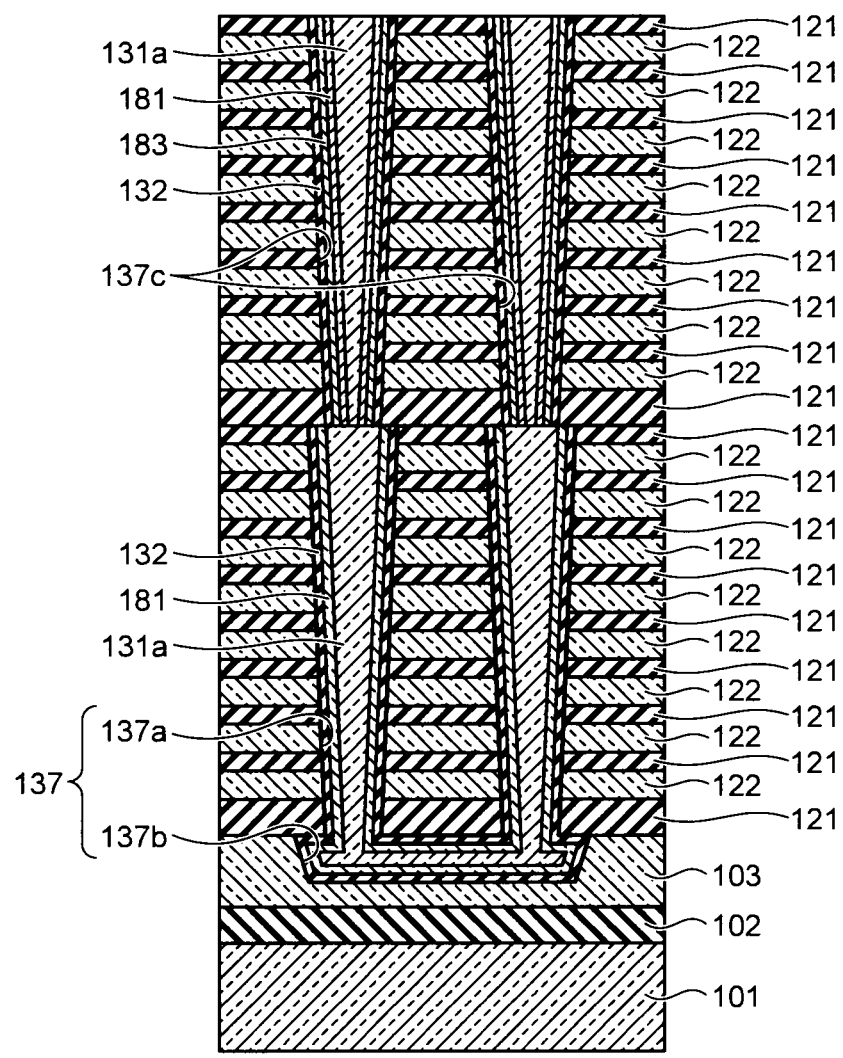

As shown in FIG. 6D, the base layers 181 made of an amorphous silicon film are further formed on the spacer silicon films 182 by the CVD method in which disilane is used as a material source. The thickness of the amorphous silicon film forming the base layers 181 is set to, for example, 0.5 nanometer, whereby it is possible to form a silicon film having thickness of 1.5 nanometers including 1 nanometer of the residual films of the spacer silicon films 182. Thereafter, continuously, the amorphous germanium films 131a are formed on the base layers 181 in the through holes 137c to be buried in the through holes 137c, on the sides of which the charge storage layers 132 are formed. Thereafter, the charge storage layers 132, the spacer silicon films 182, the base layers 181, and the amorphous germanium films 131a formed above the spacer films 121 in the top layer are removed by a method such as the CMP method. Consequently, the amorphous germanium films 131a surrounded by silicon films are buried in the through holes 137c.

Figure 6E:
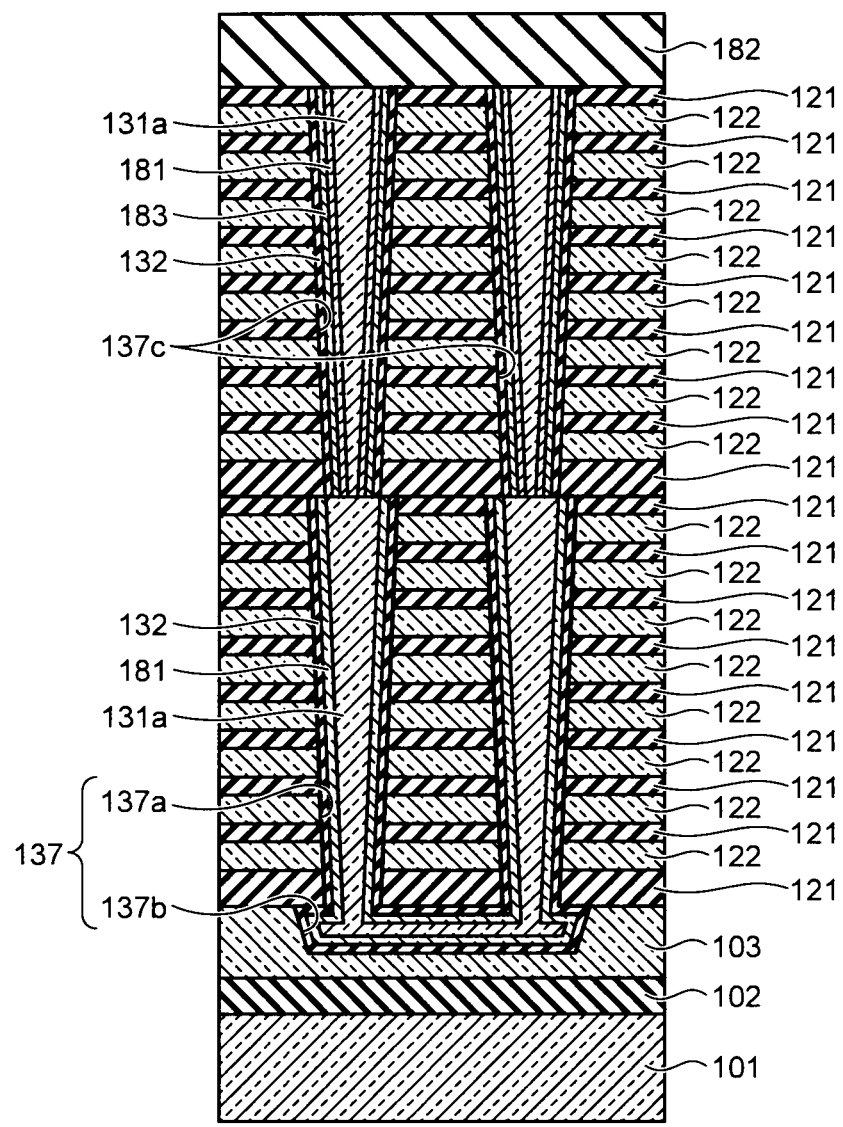

As shown in FIG. 6E, the cap film 182 made of a silicon oxide film or the like is formed on the spacer films 121, in which the amorphous germanium film 131a is buried, by a method such as the CVD method.

Thereafter, as in the second embodiment, heat treatment is performed for a predetermined time at temperature higher than a melting point determined from a concentration ratio of germanium and silicon. By the heat treatment, the amorphous germanium films 131a in the U-shaped hole 137 including the through holes 137c, the through holes 137a in the lower layer, and the communicating pipe 137b are melted while interdiffusing between the amorphous germanium films 131a and amorphous silicon films near the amorphous germanium films 131a, the amorphous germanium films 131a solidify starting from the bottoms of the through holes 137a having a relatively large amount of silicon. The semiconductor films 131C made of silicon germanium single crystal are formed in the through holes 137a and 137c. As in the second embodiment, a semiconductor film in the communicating pipe 137b connecting the bottoms of the two columnar through holes 137a is formed of a plurality of crystals obtained by the progress of the crystallization starting from the bottoms of the through holes 137a on both the sides. Therefore, the semiconductor film is not single crystal. When there are a plurality of sections where crystallization is started, the columnar semiconductor films 131C are formed in substantially single-crystal-like structure formed of a plurality of single crystals. However, in this case, the number of crystal grains forming the columnar semiconductor film 131C is, for example, equal to or smaller than ten.

Thereafter, the nonvolatile semiconductor memory device shown in FIG. 5 is obtained by forming selection transistors and wiring layers in upper layers according to a procedure same as the procedure shown in FIG. 3J and subsequent figures in the first embodiment.

A step of removing the cap film 182 can be omitted by using the cap film 182 as the interlayer insulating film 123 without removing the cap film 182. In the example explained above, the method according to the second embodiment is repeatedly executed. However, the method according to the first embodiment can also be repeatedly executed. Further, in the example explained above, as shown in FIG. 6E, the cap film 182 is formed on the spacer films 121, in which the amorphous germanium films 131a are buried, to perform the heat treatment. However, the heat treatment cal also be performed without forming the cap film 182.

According to the third embodiment, effects same as those in the first embodiment can be obtained. In the above explanation, the amorphous germanium films 131a are formed. However, polycrystal germanium films can also be formed.

Figure 7:
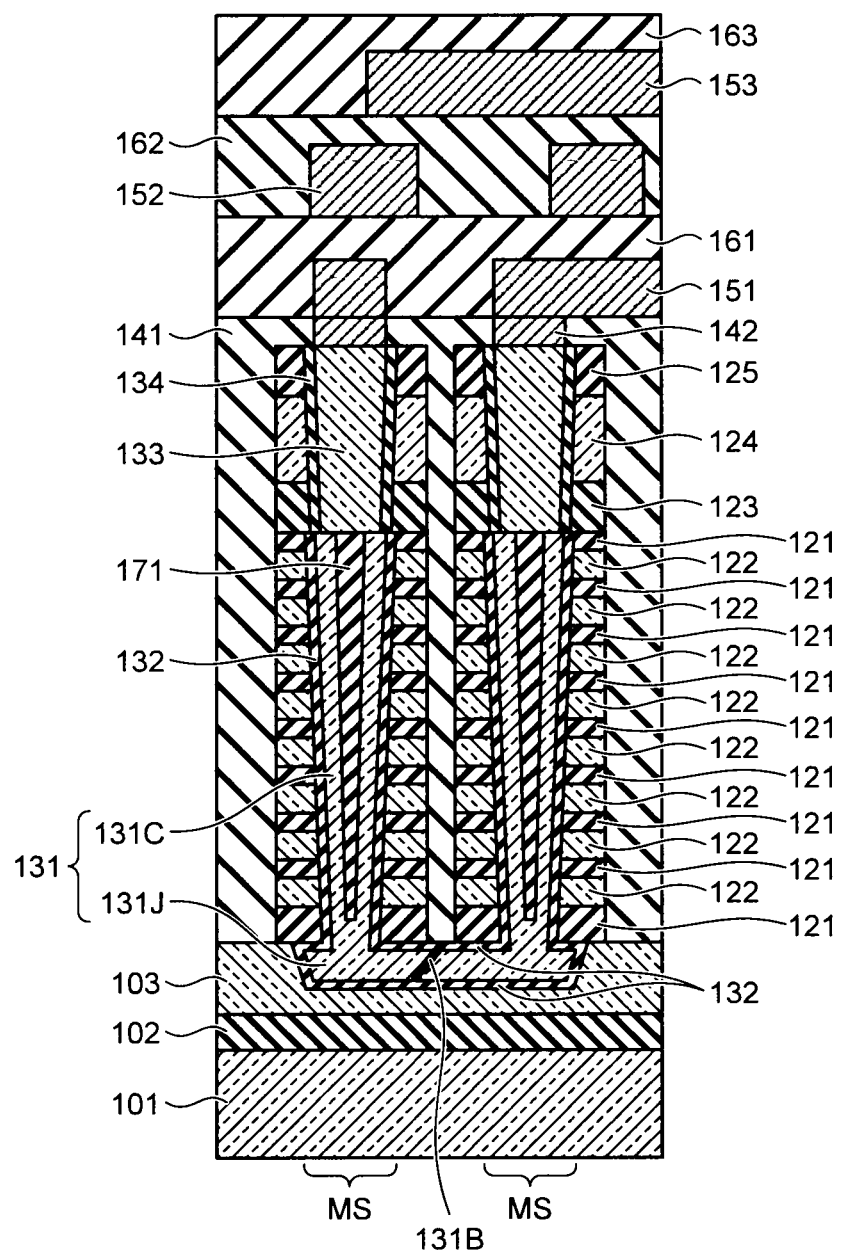
FIG. 7 is a schematic sectional view of an example of the configuration of a nonvolatile semiconductor memory device according to a fourth embodiment.

FIG. 7 is a schematic sectional view of an example of the configuration of a nonvolatile semiconductor memory device according to a fourth embodiment. A section in a direction perpendicular to a word line direction is shown. In the fourth embodiment, the semiconductor films 131C forming channels of memory cell transistors are formed of a hollow columnar single-crystal germanium film. Insulating films 171 such as silicon oxide films are formed to fill the insides of the hollow columnar semiconductor films 131C.

Because the semiconductor films 131C are formed in a hollow columnar shape (a macaroni shape) in this way, the effective thickness of the channels is reduced. Because the insides of the hollow columnar semiconductor films 131C are filled with the insulating films 171, a transistor property of the memory cells MC is improved. The thickness of the channels (the semiconductor films 131C) controlled by the control-gate electrode films 122 is equal among the stacked memory cells MC. Therefore, it is possible to suppress fluctuation in threshold voltage. Other components are the same as those in the first embodiment. Therefore, explanation of the components is omitted.

FIGS. 8A to 8E are schematic sectional views of an example of a procedure of a method of manufacturing the nonvolatile semiconductor memory device according to the fourth embodiment. In these figures, a section in the direction perpendicular to the word line direction is shown.

First, according to a procedure same as the procedure shown in FIGS. 3A to 3F in the first embodiment, after the insulating film 102, the back gate line 103, and the stacked films of the spacer films 121 and the control-gate electrode films 122 are formed above the semiconductor substrate 101 and the U-shaped hole 137 is formed, the charge storage layers 132 are formed to cover the sides of the U-shaped hole 137.

Figure 8A:
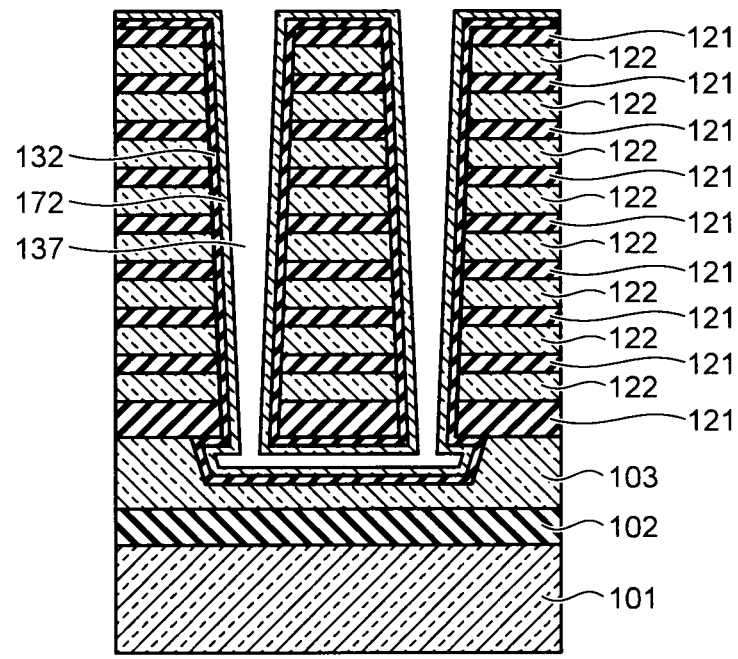
FIGS. 8A to 8E are schematic sectional views of an example of a procedure of a method of manufacturing the nonvolatile semiconductor memory device according to the fourth embodiment.
Figure 8B:
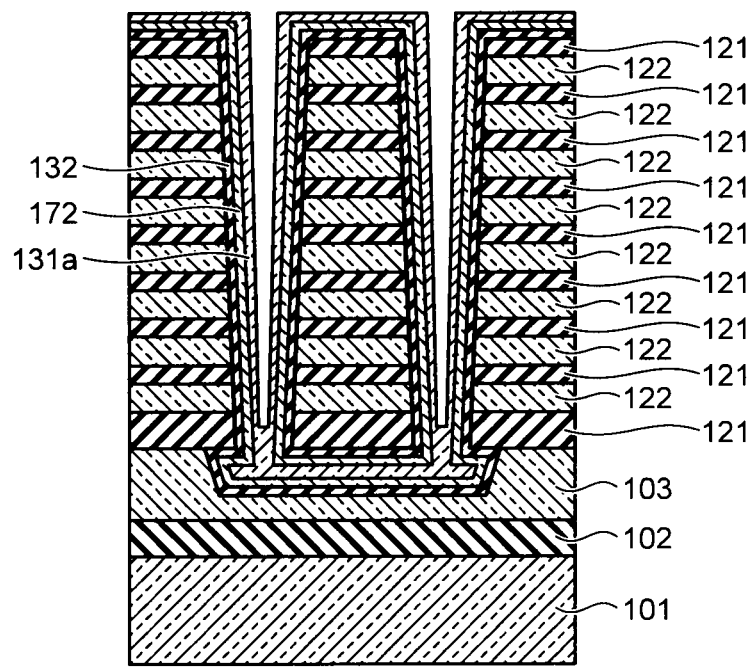

Subsequently, as shown in FIG. 8A, base layers 172 including amorphous silicon films and amorphous silicon films containing nitrogen having predetermined concentration (hereinafter, "nitrogen containing amorphous silicon films) are formed on the charge storage layers 132 by the CVD method in which higher-order silane such as disilane or trisilane is used as a material source. Consequently, the base layers 172 are formed to cover the inner surface of the U-shaped hole 137. Thereafter, continuously, as shown in FIG. 8B, the amorphous germanium films 131a are deposited on the base layers 172. The thickness of the amorphous silicon films can be set to, for example, about 2 nanometers. The thickness of the nitrogen containing amorphous silicon films can be set to, for example, about 5 nanometers. The amorphous germanium films 131a are formed to not completely fill the inside of the U-shaped hole 137. In other words, the amorphous germanium films 131a are formed in a hollow columnar shape on the inside of the columnar section of the U-shaped hole 137.

The nitrogen in the nitrogen containing amorphous silicon films is diffused in a heat process including melting of germanium performed later and is segregated on interfaces with the charge storage layers 132. The nitrogen displays an excellent effect for improvement of an insulation property of the charge storage layers 132. A lower limit of nitrogen concentration in the nitrogen containing amorphous silicon films is specified from an amount necessary for improvement of characteristics of the charge storage layers 132. An upper limit of the nitrogen concentration is specified by suppression of allowed melting due to residual nitrogen in silicon or an increase in resistance of the channels. For example, the nitrogen concentration can be set such that nitrogen in a concentration range of about $1 \times 10^{21}$ to $10^{22}$ cm$^{-3}$ is contained in the nitrogen containing amorphous silicon films.

In general, a germanium film tends to grow in an island shape. In the method according to the first embodiment, it is likely that air gaps are present between the charge storage layers 132 and the amorphous germanium films 131a and some sections of the charge storage layers 132 and the amorphous germanium films 131a are not in contact with each other. Therefore, in the fourth embodiment, first, the amorphous silicon films are formed over the entire surfaces of the charge storage layers 132 using higher-order silane that has high decomposition properties on a surface and with which uniform film formation can be easily performed. Subsequently, the nitrogen containing amorphous silicon films are formed and then, the amorphous germanium films 131a are formed. Because germanium tends to grow in a film shape (continuously) rather than in an island shape on a silicon film, the amorphous germanium films 131a grow in a film shape on the base layers 172 made of amorphous silicon. Consequently, compared with the first embodiment, air gaps are not present between the charge storage layers 132 and the amorphous germanium films 131a to be channels in a later step and the charge storage layers 132 and the amorphous germanium films 131a are in contact with each other.

Figure 8C:
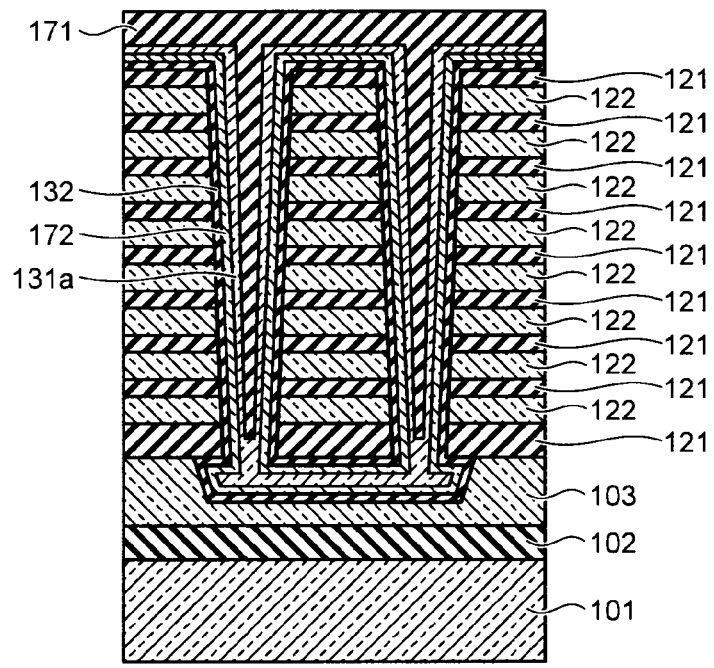

Subsequently, as shown in FIG. 8C, the insulating film 171 is formed to fill the insides of the hollow columnar amorphous germanium films 131a. The insulating film 171 is desirably formed by, for example, a film forming method having high fluidity such as the CVD method or the like at micro-decompression with high flowability or a film forming method for burying a film in a state with fluidity and altering the film into the insulating film 171 in a heat treatment process immediately after the burying. It is assumed that a silicon oxide film is buried as the insulating film 171. The insulating film 171 formed on the amorphous germanium films 131a is removed by a method such as the CMP method or the etching method.

Figure 8D:
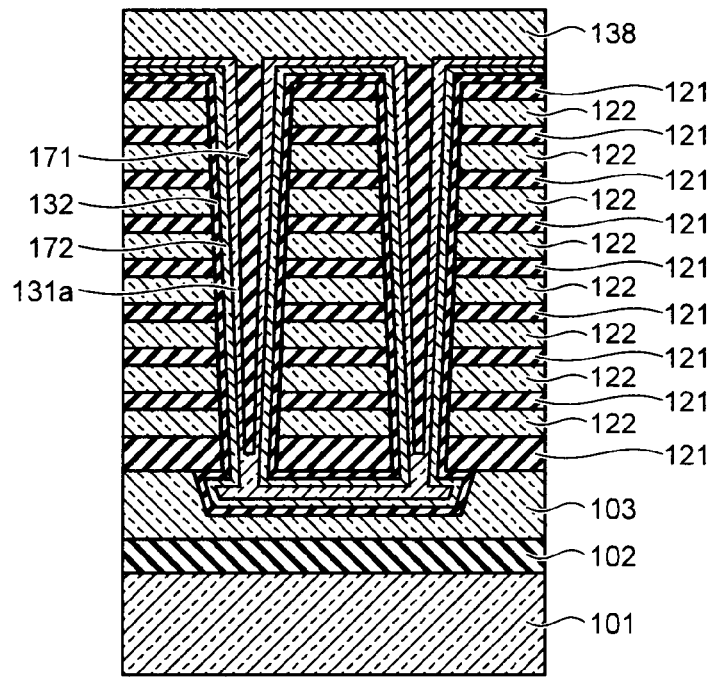
Figure 8E:
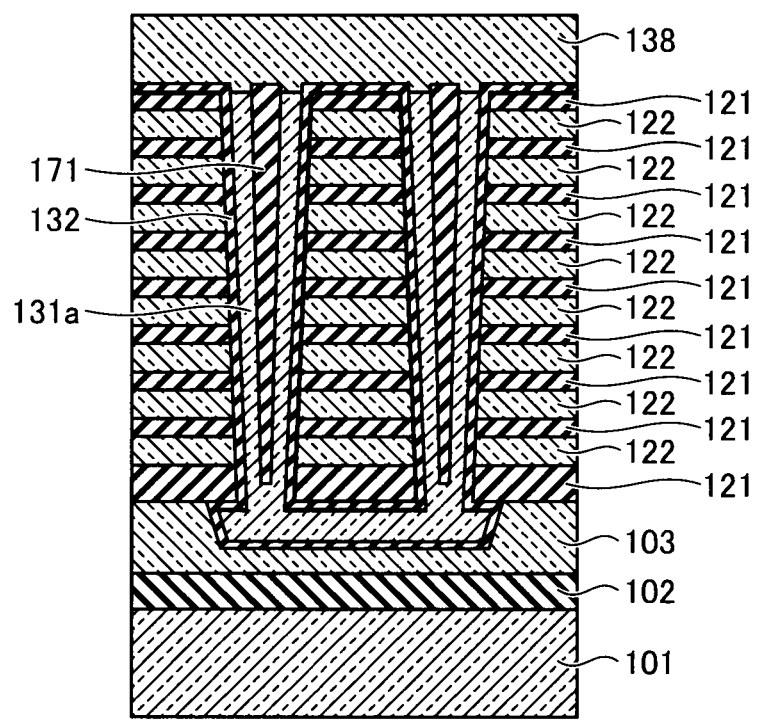

Thereafter, as shown in FIG. 8D, the seed film 138 made of a polysilicon film is formed on the amorphous germanium films 131a by a method such as the CVD method. Thereafter, as shown in FIG. 8E, in this state, heat treatment is performed for a predetermined time at temperature higher than the melting point (about 900° C.) of germanium to form the semiconductor films 131 formed of a single-crystal-like silicon germanium film on the inside of the U-shaped hole 137. The semiconductor films 131C formed in the through holes 137a are desirably single crystal but can also be the substantially single-crystal-like semiconductor films 131C formed of about several crystal grains.

In the fourth embodiment, not only germanium but also silicon is contained on the inside of the U-shaped hole 137. Because germanium and silicon substantially form alloy, melting temperature is higher than the melting point of germanium. For example, when a percentage of silicon is about 20 at % of a total of silicon and germanium, the melting point is about 1,000° C. Therefore, heat treatment temperature for stably melting the amorphous germanium films 131a and the base layers 172 made of amorphous silicon is about 1,100° C. This melting point of the alloy can be generally calculated from a ratio of germanium and silicon in the alloy because the melting point of germanium is about 900° C. and the melting point of silicon is about 1,400° C.

In the state before the heat treatment, the base layer 172 made of amorphous silicon, the amorphous germanium films 131a, and the seed layer 138 made of a polysilicon film are stacked above the stacked films of the spacer films 121 and the control-gate electrode films 122. In this region, germanium and silicon are sufficiently interdiffused to prevent germanium and silicon from being melted. Consequently, maximum temperature during the melting is specified. In other words, the maximum temperature during the melting is specified from a thickness ratio of the silicon films (a sum of thicknesses of the base layers 172 and the seed film 138) formed in the upper layer section and the amorphous germanium films 131a.

During this heat treatment, the insulating film 171 is buried on the inside of the hollow columnar amorphous germanium films 131a. Therefore, during the melting and solidifying of the amorphous germanium films 131a, occurrence of cavities (voids), which tend to occur volume contraction, or the like of the amorphous germanium films 131a, is effectively suppressed.

In this embodiment, the seed film 138 is formed in a state in which the amorphous germanium films 131a, which are formed in the upper layer of the stacked films of the spacer films 121 and the control-gate electrode films 122, are left. However, the seed film 138 can also be formed in a state in which the amorphous germanium films 131a formed in the upper layer of the stacked films are removed. However, in this case, the upper surfaces of the amorphous germanium films 131a formed on the inner surface of the U-shaped hole 137 have to be in contact with the seed film 138.

Thereafter, the nonvolatile semiconductor memory device shown in FIG. 7 is obtained by forming selection transistors and wiring layers in upper layers according to a procedure same as the procedure shown in FIG. 3J and subsequent figures in the first embodiment.

In the fourth embodiment, the charge storage layers 132, the base layers 172 made of the amorphous silicon films and the nitrogen containing amorphous silicon films, and the amorphous germanium films 131a are deposited in order to cover the sides of the U-shaped hole 137. The insulating film 171 is buried on the inside of the hollow columnar shape of the U-shaped hole 137. The seed film 138 made of the polysilicon film is formed in the upper portion of the U-shaped hole 137. The base layers 172 and the amorphous germanium films 131a in the U-shaped hole 137 are melted and solidified. Consequently, the amorphous germanium films 131a grow in a film shape on the charge storage layers 132 via the base layers 172. Adhesion between the amorphous germanium films 131a and the charge storage layers 132 can be improved. During the melting and solidifying, the nitrogen in the nitrogen containing amorphous silicon films is segregated on interfaces with the charge storage layers 132 and improves the quality of the charge storage layers 132. It is possible to obtain, in addition to the effects in the first embodiment, an effect that occurrence of cavities (voids), which tend to occur in deposition, contraction, or the like of germanium, is effectively suppressed.

In the first to fourth embodiments, silicon is used as the control-gate electrode films. However, germanium can also be used and alloy of silicon and germanium can also be used for threshold control.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile semiconductor memory device having a plurality of memory strings, in which a plurality of transistors having gate electrode films formed on sides of columnar semiconductor films via charge storage layers are connected in series in a height direction of the columnar semiconductor films, the method comprising:
   forming a first stacked film in which a predetermined number of spacer films made of an insulative material and the predetermined number of electrode films made of a conductive material are alternately stacked;
   forming a first through hole piercing through the first stacked film and a coupling hole connecting lower portions of a pair of the first through holes adjacent to each other in a predetermined direction in a lower portion of the first stacked film;
   forming a germanium film or a silicon germanium film on insides of the first through hole and the coupling hole; and
   performing heat treatment at temperature equal to or higher than a melting point of germanium and equal to or lower than a melting point of silicon.

2. The method of manufacturing a nonvolatile semiconductor memory device according to claim 1, wherein the forming the germanium film or the silicon germanium film includes forming a silicon film to be in contact with an upper surface of the germanium film or the silicon germanium film formed in the first through hole.

3. The method of manufacturing a nonvolatile semiconductor memory device according to claim 1, wherein the forming the germanium film or the silicon germanium film includes depositing an amorphous silicon film on the insides of the first through hole and the coupling hole using higher-order silane before forming the germanium film, and forming the germanium film on the amorphous silicon film.

4. The method of manufacturing a nonvolatile semiconductor memory device according to claim 1, wherein the first through hole is formed such that an opening diameter is smaller toward a lower portion of the first stacked film.

5. The method of manufacturing a nonvolatile semiconductor memory device according to claim 1, wherein the heat treatment is performed at temperature equal to or higher than a melting point calculated from a ratio of germanium and silicon near a bottom of the first through hole.

6. The method of manufacturing a nonvolatile semiconductor memory device according to claim 1, wherein the forming the germanium film or the silicon germanium film includes burying, after forming the germanium film in a hollow columnar shape to cover an inner surface of the first through hole, an insulating film on an inside of the hollow columnar germanium film or silicon germanium film.

7. The method of manufacturing a nonvolatile semiconductor memory device according to claim 1, further comprising repeatedly executing processing for forming, after forming the germanium film, on the first stacked film in which the germanium film or silicon germanium film is buried in the first through hole, a second stacked film in which a predetermined number of spacer films made of an insulative material and the predetermined number of electrode films made of a conductive material are alternately stacked, forming, on a forming position of the first through hole, a second through hole piercing through the second stacked film, and forming a germanium film or a silicon germanium film on an inside of the second through hole.

8. The method of manufacturing a nonvolatile semiconductor memory device according to claim 7, further comprising depositing, before forming the germanium film, an amorphous silicon film on the inside of the second through hole using higher-order silane and forming the germanium film on the amorphous silicon film.

9. The method of manufacturing a nonvolatile semiconductor memory device according to claim 7, wherein the forming a germanium film includes burying, after forming the germanium film in a hollow columnar shape to cover an inner surface of the second through hole, an insulating film on an inside of the hollow columnar germanium film.

10. A method of manufacturing a nonvolatile semiconductor memory device having a plurality of memory strings, in which a plurality of transistors having gate electrode films formed on sides of columnar semiconductor films via charge storage layers are connected in series in a height direction of the columnar semiconductor films, the method comprising:
    forming a stacked film in which spacer films made of an insulative material and electrode films made of a conductive material are alternately stacked;
    forming a through hole piercing through the stacked film and a coupling hole connecting lower portions of a pair of the through holes adjacent to each other in a predetermined direction in a lower portion of the stacked film;
    forming an amorphous silicon film at predetermined thickness to cover inner surfaces of the through hole and the coupling hole and subsequently forming a germanium film in the through hole and the coupling hole in which the amorphous silicon film is formed, such that at least one region having a concentration ratio of silicon and germanium different from the concentration ratio of regions around the region is present; and
    performing heat treatment at temperature equal to or higher than a melting point of germanium and equal to or lower than a melting point of silicon.

11. The method of manufacturing a nonvolatile semiconductor memory device according to claim 10, further comprising depositing, before forming the germanium film, an amorphous silicon film on insides of the through hole and the coupling hole using higher-order silane and forming the germanium film on the amorphous silicon film.

12. The method of manufacturing a nonvolatile semiconductor memory device according to claim 10, wherein the through hole is formed such that an opening diameter is smaller toward a lower portion of the stacked film.

13. The method of manufacturing a nonvolatile semiconductor memory device according to claim 10, wherein the heat treatment is performed at temperature equal to or higher than a melting point calculated from a ratio of germanium and silicon near a bottom of the through hole.

14. The method of manufacturing a nonvolatile semiconductor memory device according to claim 10, wherein the forming the germanium film includes burying, after forming the germanium film in a hollow columnar shape to cover an inner surface of the through hole, an insulating film on an inside of the hollow columnar germanium film.

* * * * *